(12) United States Patent
Crozier et al.

(10) Patent No.: US 6,720,768 B2
(45) Date of Patent: Apr. 13, 2004

(54) ASYMMETRIC RADIO FREQUENCY COILS FOR MAGNETIC RESONANCE

(75) Inventors: Stuart Crozier, Wilston (AU); Ben Lawrence, St. Lucia (AU); Desmond Yau, Toowong (AU); Kurt Luescher, Indooroopilly (AU); Wolfgang Udo Roffman, Mount Gravatt East (AU); David Michael Doddrell, Westlake (AU)

(73) Assignee: NMR Holdings No. 2 Pty Limited, Woolloomooloo (AU)

( * ) Notice: Subject to any disclaimer, the term of this patent is extended or adjusted under 35 U.S.C. 154(b) by 146 days.

(21) Appl. No.: 09/947,178

(22) Filed: Sep. 5, 2001

(65) Prior Publication Data

US 2002/0057087 A1 May 16, 2002

(51) Int. Cl.[7] .................................................. G01V 3/00
(52) U.S. Cl. ....................................... 324/318; 324/309
(58) Field of Search ................................. 324/318, 319, 324/322, 309, 307, 312; 600/410

(56) References Cited

U.S. PATENT DOCUMENTS

| | | |
|---|---|---|
| 4,694,255 A | 9/1987 | Hayes |
| 4,703,274 A | 10/1987 | Kaufman et al. |
| 5,309,104 A | 5/1994 | Frederick |
| 5,515,855 A | 5/1996 | Meyer |
| 5,542,424 A | 8/1996 | Hornak et al. |
| 5,619,996 A | 4/1997 | Beresten |
| 5,999,000 A | * 12/1999 | Srinivasan ................ 324/318 |
| 6,140,900 A | 10/2000 | Crozier et al. |
| 6,377,148 B1 | 4/2002 | Forbes et al. |

OTHER PUBLICATIONS

Fujita et al., "A hybrid inverse approach applied to the design of lumped–element RF coils," *IEEE Trans. Biomedical Engineering*, 46:353–361, Mar. 1999.

Hayes et. al., "An efficient, highly homogeneous radiofrequency coil for whole–body NMR imaging at 1.5T," *The Journal of Magnetic Resonance*, 63:622–628, 1985.

Meyer et al., "A 3×3 Mesh Two–Dimensional Ladder Network Resonator for MRI of the Human Head," *The Journal of Magnetic Resonance*, 107, 19–24, 1995.

* cited by examiner

Primary Examiner—Diego Gutierrez
Assistant Examiner—Brij B. Shrivastav
(74) Attorney, Agent, or Firm—Maurice M. Klee

(57) ABSTRACT

Asymmetric radio frequency (RF) coils for magnetic resonance applications are provided. Also provided are time harmonic methods for designing such coils as well as symmetric coils. In addition, methods for converting complex current density functions into discrete capacitive and inductive elements are provided.

13 Claims, 19 Drawing Sheets

```
┌─────────────────────────────────────┐
│ Determine the curl-free and divergence-free │
│ terms from the calculated current density J │
│ according to equations (59) and (61) │
└─────────────────────────────────────┘
                  │
                  ▼
┌─────────────────────────────────────┐
│   Calculate the stream functions    │
│   n.S and $\psi$ from the curl-free and │
│   div-free J terms, see equations   │
│              (57)-(62)              │
└─────────────────────────────────────┘
                  │
                  ▼
┌─────────────────────────────────────┐
│      Contour the stream functions   │
│   (see, for example, FIGs 9 and 10) │
└─────────────────────────────────────┘
                  │
                  ▼
┌─────────────────────────────────────┐
│ The contours of n.S indicate conductor │
│ positions. The contours of $\psi$ indicate │
│     potential dielectric distributions │
└─────────────────────────────────────┘
                  │
                  ▼
┌─────────────────────────────────────┐
│ Simulate the new coil in, for example, │
│  a commerical method-of-moments     │
│  program or similar. Adjust lumped  │
│  element capacitors if necessary.   │
└─────────────────────────────────────┘
                  │
                  ▼
┌─────────────────────────────────────┐
│          Solution complete          │
└─────────────────────────────────────┘
```

FIG. 18

ASYMMETRIC RADIO FREQUENCY COILS FOR MAGNETIC RESONANCE

FIELD OF THE INVENTION

This invention relates to radio frequency coils for magnetic resonance (MR) applications. In particular, the invention is directed to asymmetric radio frequency coils for magnetic resonance imaging (MRI) machines.

In certain of its aspects, the invention provides methods for designing radio frequency coils for magnetic resonance applications which may be symmetric or asymmetric.

The radio frequency coils of the invention may be used for transmitting a radio frequency field, receiving a magnetic resonance signal, or both transmitting a radio frequency field and receiving a magnetic resonance signal. When the radio frequency coil serves a transmitting function, it will normally be combined with a shield to reduce magnetic interference with external components of the magnetic resonance imaging system.

BACKGROUND OF THE INVENTION

In magnetic resonance imaging (MRI) applications, a patient is placed in a strong and homogeneous static magnetic field, causing the otherwise randomly oriented magnetic moments of the protons, in water molecules within the body, to precess around the direction of the applied field. The part of the body in the homogeneous region of the magnet is then irradiated with radio-frequency (RF) energy, causing some of the protons to change their spin orientation. The net magnetization of the spin ensemble is nutated away from the direction of the applied static magnetic field by the applied RF energy. The component of this net magnetization orthogonal to the direction of the applied static magnetic field acts to induce measurable signal in a receiver coil tuned to the frequency of precession. This is the magnetic resonance (MR) signal.

The useful RF components are those generated in at plane at 90 degrees to the direction of the static magnetic field. The same coil structure that generates the RF field can be used to receive the MR signal or a separate receiver coil placed close to the patient may be used. In either case the coils are tuned to the Larmor precessional frequency $\omega_0$ where $\omega_0 = \gamma B_0$ and $\gamma$ is the gyromagnetic ratio for a specific nuclide and $B_0$ is the applied static magnetic field.

A desirable property of radio frequency coils for use in MR is the generation of homogeneous RF fields over a prescribed region. Normally this region is central to the coil structure for transmission resonators. A well known example of transmission resonators is the birdcage resonator, details of which are given by Hayes et. al. in The Journal of Magnetic Resonance, 63, 622 (1985) and U.S. Pat. No. 4,694,255.

In some circumstances it is desirable to generate a target field over an asymmetric region of the coil structure, i.e., a region that is asymmetric relative to the mid-length point of the longitudinal axis of the coil structure. This is potentially advantageous for patient access, conformation of the coil structure to the local anatomy of the patient and for use in asymmetric magnet systems.

One method that is known in the art for generating homogeneous fields over a volume that is asymmetric to the coil structure is to enclose one end of the cylindrical structure, a so-called 'end-cap' or dome structure (details of which are given by Meyer and Ballon in The Journal of Magnetic Resonance, 107, 19 (1995) and by Hayes in SMRM 5$^{th}$ annual meeting, Montreal, Book of Abstracts, 39 (1986)). These designs were applied to structures that surrounded only the head of a patient and, by their nature, prevent access to the top of the head. The limited access also makes these structures problematic for whole-body imaging as they substantially reduce access from one end of the magnet.

It is an object of this invention to provide coil structures that generate desired RF fields within certain specific, and asymmetric portions of the overall coil structure, preferably without substantially limiting access from one end of the structure. Asymmetric radio frequency coils can be used in conventional MR systems or in the newly developed asymmetric magnets of U.S. Pat. No. 6,140,900.

It is a particular object of the present invention to provide a general systematic method for producing a desired radio frequency field within a coil, using a full-wave, frequency specific technique to first define a current density on at least one cylindrical surface and subsequently to synthesize a coil pattern from the current density.

It is a further particular object of the present invention to use complex current densities in the full-wave, frequency specific method.

SUMMARY OF THE INVENTION

In one broad form, the invention in accordance with certain of its aspects provides a coil structure for a magnetic resonance device having a cylindrical space with open ends, the coil structure being adapted to generate a desired RF field within a specified portion of the cylindrical space. In accordance with the product aspects of the invention, this portion is asymmetrically located relative to the mid-length point of the longitudinal axis of the cylindrical space.

In connection with another aspect, the invention provides a method for manufacturing a radio frequency coil structure for a MR device having a cylindrical space, preferably with open ends, comprising the steps of selecting a target region over which a transverse RF magnetic field of a predetermined frequency is to be applied by the coil structure, the target region being preferably asymmetrically located relative to the mid-length point of the longitudinal axis of the cylindrical space, calculating current density at the surface of the cylindrical space required to generate the target field at the predetermined frequency, synthesizing a design for the coil structure from the calculated current density in accordance with one of the methods discussed below, and forming a coil structure according to the synthesized design.

Preferably, the method for calculating the current density uses a time harmonic method that accounts for the frequency of operation of the RF coil structure and makes use of a complex current density.

The RF coils of the invention can be used as transmitter coils, receiver coils, or both transmitter and receiver coils. As discussed above, when the coil serves a transmitting function, it will normally be combined with a shield to reduce magnetic interference with external components of the magnetic resonance imaging system. To avoid redundancy, the following summary of the method aspects of the invention is in terms of a RF coil system which includes a main coil (corresponding to the "first complex current density") and a shielding coil (corresponding to the "second complex current density"), it being understood that these methods can be practiced with just a main coil.

In accordance with a first method aspect of the invention, which can be used under "mild" coil length to wavelength conditions, i.e., conditions in which the coil length is less than about one-fifth of the operating wavelength, a method for designing apparatus for transmitting a radio frequency field (e.g., a field having a frequency of at least 20 Megahertz, preferably at least 80 Megahertz), receiving a magnetic resonance signal, or both transmitting a radio frequency field and receiving a magnetic resonance signal is provided which comprises:

(a) defining a target region (e.g., a spherical or ellipsoidal region preferably having a volume of at least $30 \times 10^3$ cm$^3$ and asymmetrically located relative to the midpoint of the RF coil, e.g., the ratio of the distance between the midpoint of the target region and one end of the coil to the length of the coil is less than or equal to 0.4) in which the radial magnetic component (e.g., $B_x$, $B_y$, or combinations of $B_x$ and $B_y$) of the radio frequency field is to have desired values (e.g., substantially uniform magnitudes), said target region surrounding a longitudinal axis, i.e., the common longitudinal axis of the magnetic resonance imaging system and the RF coil;

(b) specifying desired values for said radial magnetic component of the radio frequency field at a preselected set of points within the target region (e.g., a set of points distributed throughout the target region or a set of points distributed at the outer boundary of the target region);

(c) defining a target surface (e.g., the shield coil surface) external to the apparatus on which the magnetic component of the radio frequency field is to have a desired value of zero at a preselected set of points on said target surface;

(d) determining a first complex current density function, having real and imaginary parts, on a first specified cylindrical surface (i.e., the main coil surface) and a second complex current density, having real and imaginary parts, on a second specified cylindrical surface (i.e., the shield coil surface), the radius of the second specified cylindrical surface being greater than the radius of the first specified cylindrical surface (e.g., the radius of the second surface can be 10% greater than the radius of the first surface) by:

(i) defining each of the complex current density functions as a sum of a series of basis functions (e.g., triangular and/or pulse or sinusoidal and/or cosinusoidal functions) multiplied by complex amplitude coefficients having real and imaginary parts; and (ii) determining values for the complex amplitude coefficients using an iterative minimization technique (e.g., a linear steepest descent or a conjugate gradient descent technique) applied to a first residue vector obtained by taking the difference between calculated field values obtained using the complex amplitude coefficients at the set of preselected points in the target region and the desired values at those points and a second residue vector equal to calculated field values obtained using the complex amplitude coefficients at the preselected set of points on the target surface; and (e) converting said first and second complex current density functions into sets of capacitive elements (as understood by persons skilled in the art, such capacitive elements will in general have some inductive and resistive properties) and sets of inductive elements (as understood by persons skilled in the art, such inductive elements will in general have some capacitive and resistive properties) located on the specified cylindrical surfaces by:

(i) converting each of the first and second complex current density functions into a curl-free component $J_{curl\text{-}free}$ and a divergence-free component $J_{div\text{-}free}$ using the relationships:

$$J_{curl\text{-}free} = \nabla \psi, \text{ and}$$

$$J_{div\text{-}free} = \nabla \times S,$$

where $\psi$ and $S$ are functions obtained from the respective first and second complex current density functions through the equations:

$$\nabla^2 \psi = \nabla \cdot J,$$

$$-\nabla^2 S = \nabla \times J, \text{ and}$$

$$-\nabla^2 (n \cdot S) = n \cdot \nabla \times J,$$

where n is a vector normal to the respective first and second specified cylindrical surfaces and J is the respective first and second complex current density functions;

(ii) calculating locations on the respective first and second cylindrical surfaces for the respective sets of capacitive elements by contouring the respective $\psi$ functions; and (iii) calculating locations on the respective first and second cylindrical surfaces for the respective sets of inductive elements by contouring the respective functions n·S ($\psi$ and n·S are referred to herein and function as "streaming functions").

In accordance with a second method aspect of the invention, which can be used under "non-mild" coil length to wavelength conditions, i.e., conditions in which the coil length can be greater than about one-fifth of the operating wavelength, a method for designing apparatus for transmitting a radio frequency field or both transmitting a radio frequency field and receiving a magnetic resonance signal is provided which comprises:

(a) defining a target region in which the radial magnetic component of the radio frequency field is to have desired values, said target region surrounding a longitudinal axis, i.e., the common longitudinal axis of the magnetic resonance imaging system and the RF coil;

(b) specifying desired values for said radial magnetic component of the radio frequency field at a preselected set of points within the target region;

(c) defining a target surface external to the apparatus on which the magnetic component of the radio frequency field is to have a desired value of zero;

(d) determining a first complex current density function, having real and imaginary parts, on a first specified cylindrical surface and a second complex current density, having real and imaginary parts, on a second specified cylindrical surface, the radius of the second specified cylindrical surface being greater than the radius of the first specified cylindrical surface:

(i) defining each of the complex current density functions as a sum of a series of basis functions (e.g., sinusoidal and/or cosinusoidal functions) multiplied by complex amplitude coefficients having real and imaginary parts; and (ii) determining values for the complex amplitude coefficients by simultaneously solving matrix equations of the form:

$$[A_1^C](a^C) + [A_1^S](a^S) = B^C \quad \text{(Eq. I)}$$
$$[A_2^C](a^C) + [A_2^S](a^S) = B^S$$

where $A_1^C$, $A_1^S$, $A_2^C$, and $A_2^S$ are transformation matrices between current density space and magnetic field space whose components are based on time harmonic Green's functions, $a^C$ and $a^S$ are vectors of the unknown complex amplitude coefficients for the first and second complex current density functions, respectively, $B^C$ is a vector of the desired values for the radial magnetic field specified in step (b), and $B^S$ is a vector whose values are zero, said equations being solved by:

(1) transforming the equations into functionals that can be solved using a preselected regularization technique, and (2) solving the functionals using said regularization technique to obtain values for the complex amplitude coefficients; and (e) converting said first and second complex current density functions into sets of capacitive elements and sets of inductive elements located on the specified cylindrical surfaces (preferably, this step is performed using the methods of step (e) of the first method aspect of the invention; also the methods of said step (e) can be used independent of either the first or second method aspects of the invention to convert a complex current density function to sets of capacitive and inductive elements, i.e., to a manufacturable coil structure).

In accordance with certain preferred embodiments of this second method aspect of the invention, the regularization functional is chosen so as to minimize the integral of the dot product of the first complex current density function with itself over the first specified cylindrical surface and to minimize the integral of the dot product of the second complex current density function with itself over the second specified cylindrical surface. Other regularization functionals that can be used include: (1) the second derivative of the complex current density functions, and (2) other functionals besides the dot product that are proportional to the square of the complex current density functions.

In accordance with other preferred embodiments, the complex amplitude coefficients are chosen so that the first and second complex current density functions each has zero divergence.

The parenthetical statements set forth in connection with the summary of the first method aspect of the invention also apply to the second method aspect of the invention except where indicated. In connection with all of its method aspects, the invention also preferably includes the additional step(s) of displaying the locations of the sets of inductive elements on the first and second specified cylindrical surfaces and/or producing physical embodiments of those sets of elements.

In accordance with certain of its product aspects, the invention provides apparatus for use in a magnetic resonance system for transmitting a radio frequency field (e.g., a field having a frequency greater than, for example, 20 megahertz, and preferably greater than 80 megahertz), receiving a magnetic resonance signal, or transmitting a radio frequency field and receiving a magnetic resonance signal, said apparatus and said magnetic resonance imaging system having a common longitudinal axis, said apparatus comprising:

(a) a support member (e.g., a tube composed of fiberglass, TEFLON, or other materials, which preferably can be used as a substrate for a photolithography procedure for printing conductive patterns and which does not substantially absorb RF energy) which defines a bore (preferably a cylindrical bore) having first and second open ends which are spaced from one another along the longitudinal axis by a distance L (the open ends are preferably both sized to receive a patient's body part which is to be imaged, e.g., the head, the upper torso, the lower torso, a limb, etc.); and (b) a plurality of inductive elements (e.g., copper or other metallic tracks or tubes) and a plurality of capacitive elements (e.g., distributed or lumped elements) associated with the support member (e.g., mounted on and/or mounted in and/or mounted to the support member);

wherein if used as a transmitter, the apparatus has the following characteristics (the "if used as a transmitter" terminology is used in defining both transmitting and receiving RF coils since by reciprocity, coils that transmit uniform radio frequency fields, receive radio frequency fields with a uniform weighting function):

(i) the apparatus produces a radio frequency field which has a radial magnetic component which has a spatially-varying peak magnitude whose average value is $A_{r\text{-}avg}$;

(ii) the apparatus has a homogenous volume within the bore over which the spatially-varying peak magnitude of the radio frequency field has a maximum deviation from $A_{r\text{-}avg}$ which is less than or equal to 15% (preferably less than or equal to 10%);

(iii) the homogeneous volume defines a midpoint M which is on the longitudinal axis, is closer to the first end than to the second end, and is spaced from the first end by a distance D such that the ratio D/L is less than or equal to 0.4 (preferably less than or equal to 0.25); and (iv) at least one of said inductive elements (e.g., 1, 2, 3, . . . or all) comprises a discrete conductor (e.g., a copper or other metallic track or tube) which follows a sinuous path such that during use of the apparatus current flows through a first part of the conductor in a first direction that has both longitudinal and azimuthal components and through a second part of the conductor in a second direction that has both longitudinal and azimuthal components, said first and second directions being different. An example of such a sinuous path is shown in FIG. 15 discussed below.

In certain preferred embodiments, the homogenous volume is at least $30 \times 10^3$ cm$^3$ and/or L is at least 1.0 meter.

In other preferred embodiments, the first and second open ends have transverse cross-sectional areas $A_1$ and $A_2$, respectively, which satisfy the relationship:

$|A_1 - A_2|/A_1 < 0.1$.

where $A_1$ is preferably at least $2 \times 10^3$ cm$^2$.

In connection with all of the aspects of the invention, the lengths of coils and of cylindrical spaces associated therewith are defined in terms of the inductive elements making up the coil. In particular, for a horizontally oriented coil, the length constitutes the distance along the longitudinal axis from the leftmost edge of the leftmost inductive element to the rightmost edge of the rightmost inductive element, corresponding definitions applying to other orientations of the coil.

BRIEF DESCRIPTION OF THE DRAWINGS

The invention will be described by way of examples with reference to the drawings in which:

In FIG. 4A, $z_{os}$=20 mm, while in FIG. 4B, $z_{os}$=50 mm;

FIG. 18 is a flow chart illustrating a preferred method for calculating a coil geometry from a current density.

The foregoing drawings, which are incorporated in and constitute part of the specification, illustrate the preferred embodiments of the invention, and together with the description, serve to explain the principles of the invention. It is to be understood, of course, that both the drawings and the description are explanatory only and are not restrictive of the invention.

DETAILED DESCRIPTION OF EMBODIMENTS OF THE INVENTION

Figure 16:
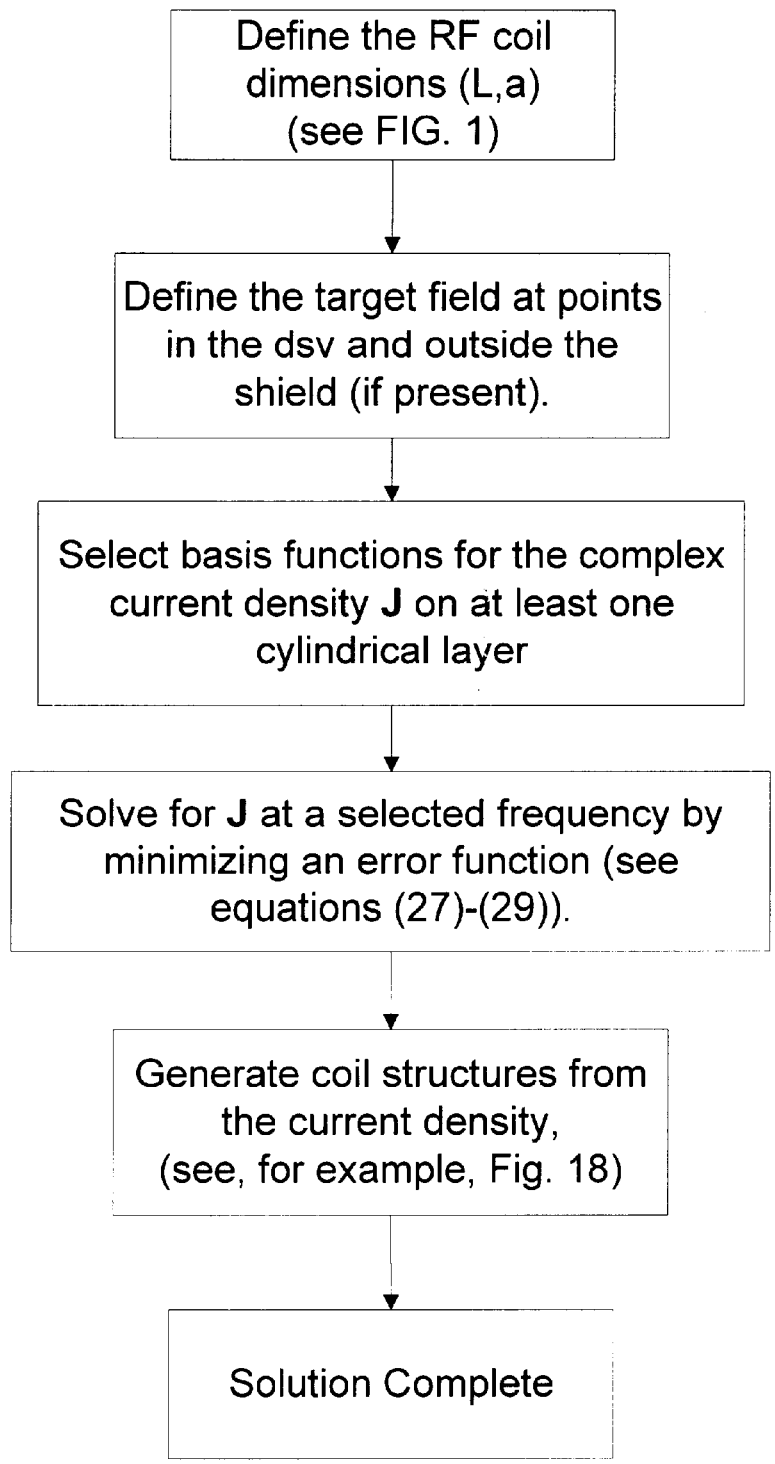
FIG. 16 is a flow chart illustrating the first method aspect of the invention.
Figure 17:
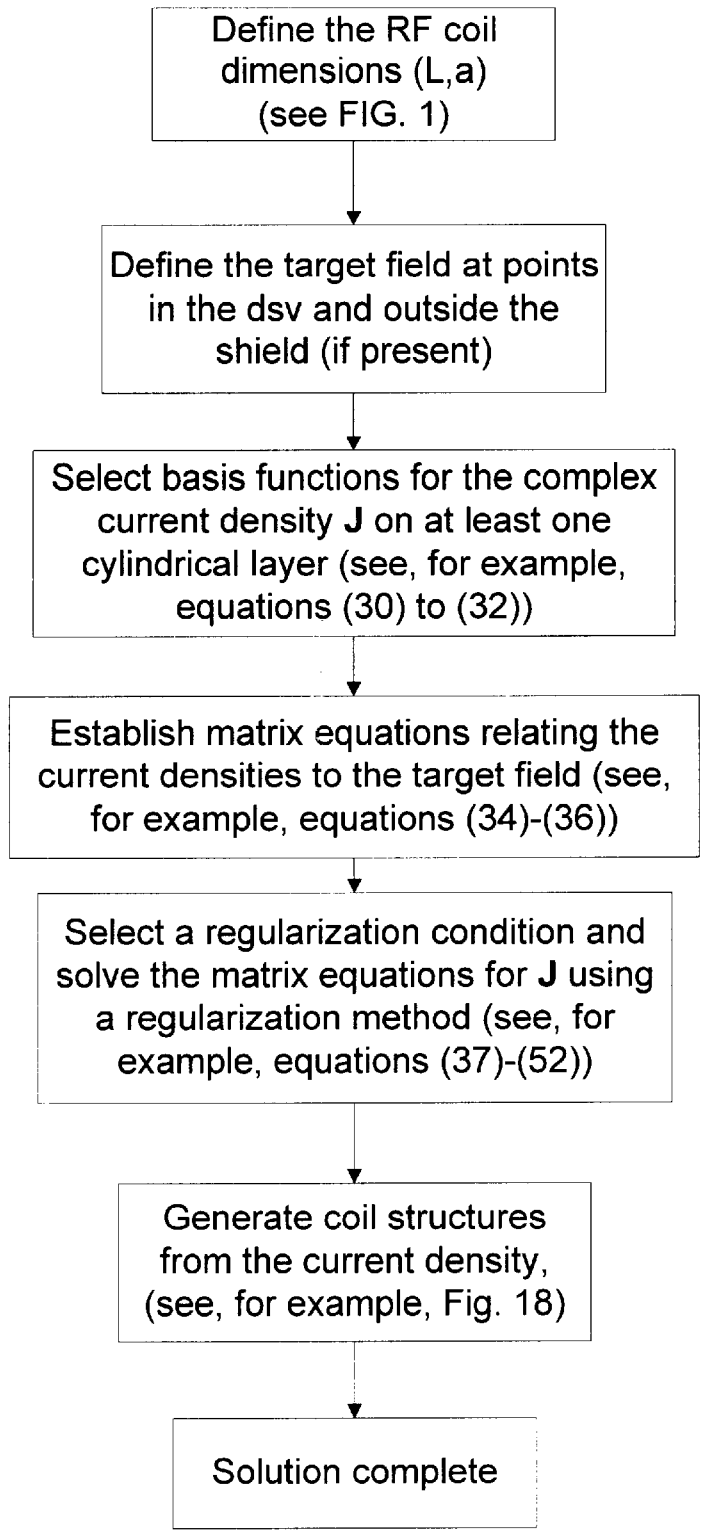
FIG. 17 is a flow chart illustrating the second method aspect of the invention.

As discussed above, the present invention relates to RF coils having prescribed properties and to methods for designing these and other types of RF coils. FIGS. 16–18 illustrate the overall numerical procedures of the invention with reference to the various equations presented below.

The methods of the invention as described below are preferably practiced on a digital computer system configured by suitable programming to perform the various computational steps. The programming can be done in various programming languages known in the art. A preferred programming language is the C language which is particularly well-suited to performing scientific calculations. Other languages which can be used include FORTRAN, BASIC, PASCAL, $C^{++}$, and the like. The program can be embodied as an article of manufacture comprising a computer usable medium, such as a magnetic disc, an optical disc, or the like, upon which the program is encoded.

The computer system can comprise a general purpose scientific computer and its associated peripherals, such as the computers and peripherals currently being manufactured by DIGITAL EQUIPMENT CORPORATION, IBM, HEWLETT-PACKARD, SUN MICROSYSTEMS, SGI or the like. For example, the numerical procedures of the invention can be implemented in C-code and performed on a work station. The system should include means for inputting data and means for outputting the results of the RF coil design both in electronic and visual form. The output can also be stored on a disk drive, tape drive, or the like for further analysis and/or subsequent display.

QUASI-STATIC ANALYSIS

In outline, the object of the design process is to produce structures that generate target RF transverse fields (that is, $B_x$ or $B_y$ or combinations thereof) over a defined volume inside a cylinder. The value of $B_x$ (for example) is specified at a number of chosen points inside this region and in one embodiment, inverse methods are used to compute the corresponding current distribution.

Figure 1:
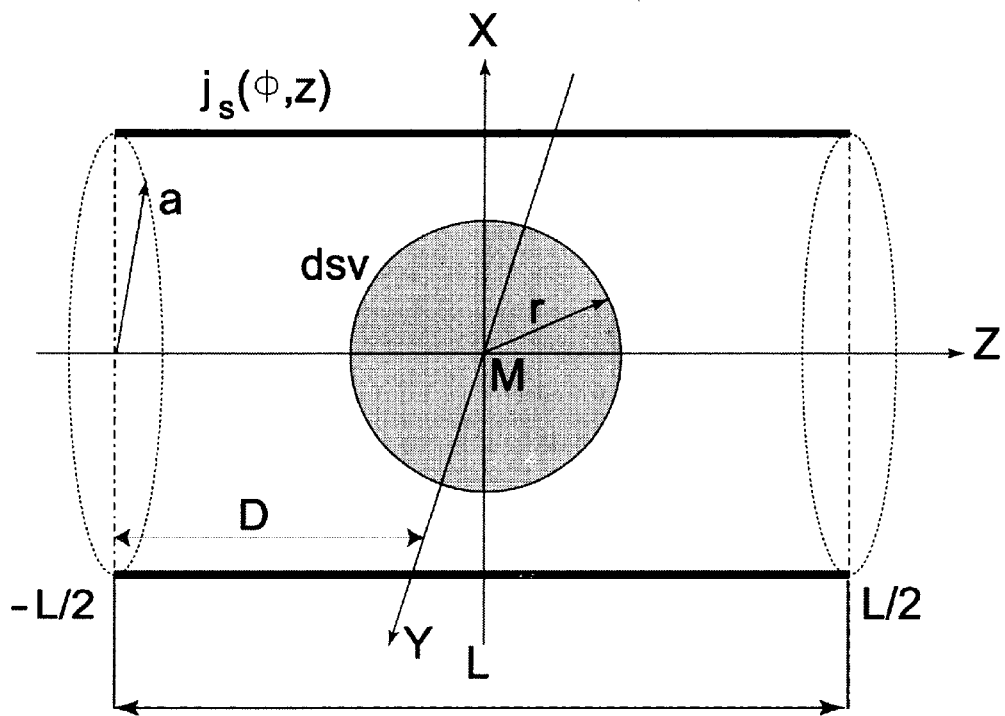
FIG. 1 illustrates a general layout of a cylindrical radio frequency coil system of length L and radius a. Changing the value of D changes the degree of symmetry of the 'target region' relative to the coil structure.

The geometry of the coil is shown in FIG. 1. Surface current densities on the cylinder are defined as:

$$J(r) = J_\phi(\phi, z)\hat{\phi} + J_z(\phi, z)\hat{z} \text{ for } \rho=\alpha \text{ and } -L/2 \leq z \leq L/2 \quad (1)$$

where $r=\rho\hat{\rho}+z\hat{z}$; L and $\alpha$ are the length and radius of the cylinder.

As is known in the art, in one formulation for the case of a symmetric coil structure, J(r) can be written as a summation of M sinusoidal basis functions:

$$J_\phi(\phi, z) = \cos\phi \sum_{m=1}^{M} J_{cm} \sin(k_m z) \quad (2)$$

$$J_z(\phi, z) = \sin\phi \sum_{n=1}^{M} \frac{-J_{cm}}{k_m a} \cos(k_m z) \quad (3)$$

where $J_{cm}$ are the current coefficients and $k_m=(2m-1)\pi/L$.

However, this expression is only applicable to problems where the magnetic field is symmetrical about z=0. Magnetic fields are expressed in terms of magnetic vector potentials defined as the convolution of surface current density with the corresponding Green's function in the spatial domain:

$$A(r) = \frac{\mu_0 a}{4\pi} \int_{-L/2}^{L/2} \int_0^{2\pi} G(r \mid r') J(r') d\phi' \, dz' \text{ for } \rho = a \quad (4)$$

where the dashed elements indicate source points and the undashed the field points. The corresponding generalized Green's function in Cartesian coordinates is:

$$G(r \mid r') = \frac{e^{-jk_0|r-r'|}}{|r-r'|} \quad (5)$$

where r and r' are the position vectors of field and source points respectively; $k_0$ is the wave-number given by $k_0=2\pi/\lambda_0$ and $\lambda_0$ is the free-space wavelength of the propagating field.

We consider first an initial quasi-static simplification in which the wavelength is assumed to be very long, or the frequency near zero. Equation (5) then approaches:

$$G(r \mid r') = \frac{1}{|r-r'|} \quad (6)$$

In cylindrical coordinates one solution of this is:

$$G(r \mid r') = \frac{2}{\pi} \sum_{p=-\infty}^{+\infty} e^{jp(\phi-\phi')} \int_0^\infty dk \cos[k(z-z')] I_p(k\rho) K_p(k\rho') \quad (7)$$

where r (r') are again defined as the position vectors of field (source) respectively. $I_p$ and $K_p$ are the modified Bessel functions of $p^{th}$ order. This solution is for the case where observation points are internal to the cylinder, i.e., $\rho' > \rho$.

The vector potentials may then be expressed as:

$$A_\rho(r) = \frac{\mu_0 a}{4\pi} \int_{-L/2}^{L/2} \int_0^{2\pi} G(r \mid r') J_\phi(r') \sin(\phi - \phi') d\phi' dz' \quad (8)$$

$$A_\phi(r) = \frac{\mu_0 a}{4\pi} \int_{-L/2}^{L/2} \int_0^{2\pi} G(r \mid r') J_\phi(r') \cos(\phi - \phi') d\phi' dz' \quad (9)$$

$$A_z(r) = \frac{\mu_0 a}{4\pi} \int_{-L/2}^{L/2} \int_0^{2\pi} G(r \mid r') J_z(r') d\phi' dz' \quad (10)$$

Substituting equation (7) into the above equations and carrying out the integration over the cylinder's surface, we obtain the expression for (8)–(10) in the form of Fourier integral (series) or in terms of spectral variable k (m). The relevant magnetic fields are calculated from the curl of the vector potentials to be:

$$B_\rho(r) = \frac{j\mu_0 a}{\pi} \sum_{p=-\infty}^{\infty} e^{jp\phi} \int_0^\infty k \cos kz \, J_\phi(m,k) I'_p(k\rho) K'_p(ka) dk \quad (11)$$

$$B_\phi(r) = \frac{j\mu_0 a}{\pi\rho} \sum_{p=-\infty}^{\infty} pe^{jp\phi} \int_0^\infty \cos kz \, J_\phi(m,k) I_p(k\rho) K'_p(ka) dk \quad (12)$$

Writing the currents as summation of (2) and (3) and using the following relationship:

$$B_x = B_\rho \cos\phi - B_\phi \sin\phi \quad (b\,13)$$

we obtain

The result described in equations (14) and (15) is known in the art as a quasi-static solution, being only valid in applications where the free space wavelength is much longer than the length of the cylinder generating the RF fields (see for example, H. Fujita, L. S. Petropoulos, M. A. Morich, S. M. Shvartsman, and R. W. Brown 'A hybrid inverse approach applied to the design of lumped-element RF coils,' *IEEE Trans. Biomedical Engineering*, vol-46, pp. 353–361, Mar. 1999).

A target region is then defined as the volume within which a homogenous $B_x$ is required. In particular, a target field value ($B_{xt}$) is defined as the fixed magnitude of the desired homogeneous field $B_x$. The target region is, for example, specified as the volume inside a sphere of radius R centered at z=0. As an example, a target specification could be that R is set to be R≈0.7α and max($B_x$)−min($B_x$) is specified at less than 5%. If we set $B_x(r_1)=B_x(r_2)=B_x(r_3)=\ldots=B_x(r_N)=B_{xt}$ where $r_1, r_2, r_3 \ldots r_N$ are the target field points chosen inside the target region, a set of N linear equations is obtained from equation (14).

In particular, the following matrix equation is obtained:

$$B_{xt} \times [1]_{N\times 1} = [T]_{N\times M} [J_{cm}] M \times 1 \quad (16)$$

where [T] is a matrix containing the values of $B_x$ at the defined observation points due to each of the current components; $[J_{cm}]$ is a column vector of the current coefficients $J_{c1}, J_{c2}, J_{c3} \ldots J_{cm}$ and [1] is a unity column vector.

If the number of linear equations equals the number of unknowns (M=N), then the numerical solution for $[J_{cm}]$ can be easily obtained by multiplying both sides of (16) by $[T]^{-1}$.

As an example of the quasi-static method, a coil of dimension: α=100 mm, L=320 mm was designed. The specified target field in spherical coordinates was:

| $B_{xt} = B_x$ | $r_1$ | $r_2$ | $r_3$ |  | $\phi_1$ | $\phi_2$ | $\phi_3$ | $\theta_1$ | $\theta_2$ | $\theta_3$ |
|---|---|---|---|---|---|---|---|---|---|---|
| 23.5 μT | 50 | 50 | 50 (mm) |  | 90° | 90° | 45° | 90° | 0 | 45° |

The current density coefficients up to M=3 were then calculated from the quasi-static expressions in equations (14) to be:

| $J_{c1}$ | $J_{c2}$ | $J_{c3}$ |
|---|---|---|
| 43.834274291992190 | −48.744728088378910 | 36.222351074218750 |

Figure 2:
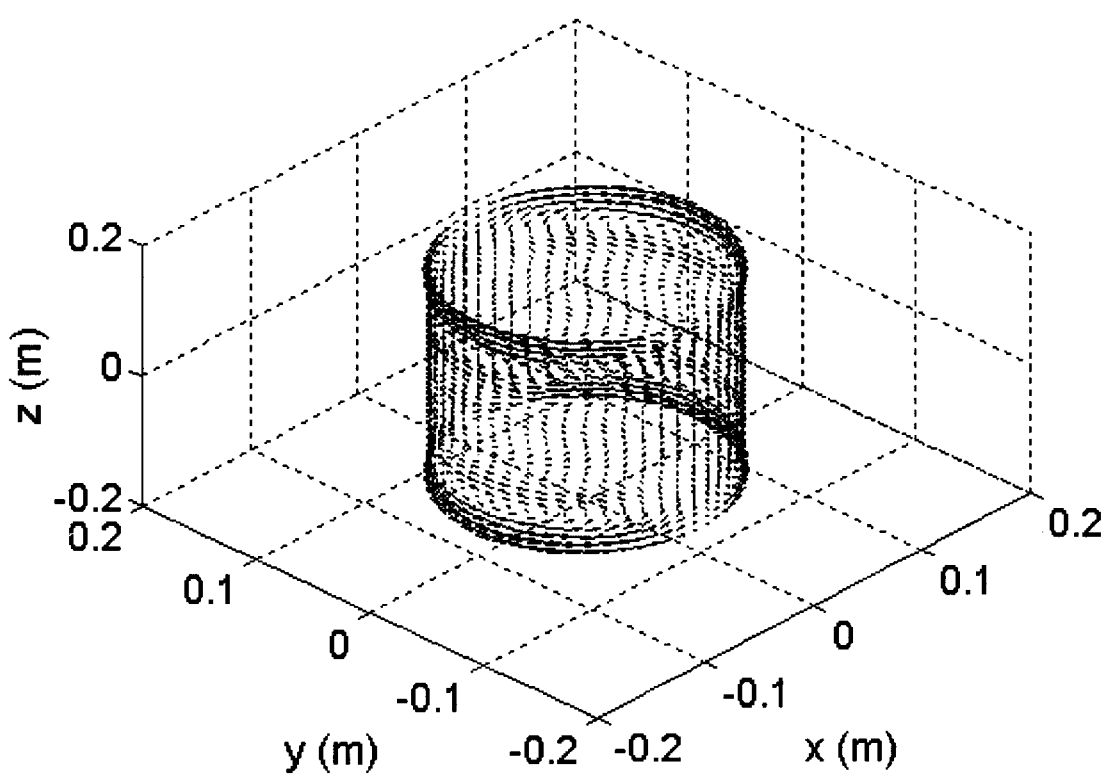
FIG. 2 shows a current distribution on the surface of a cylinder calculated using a quasi-static formulation, where the vertical axis is the z-axis.
Figure 3:
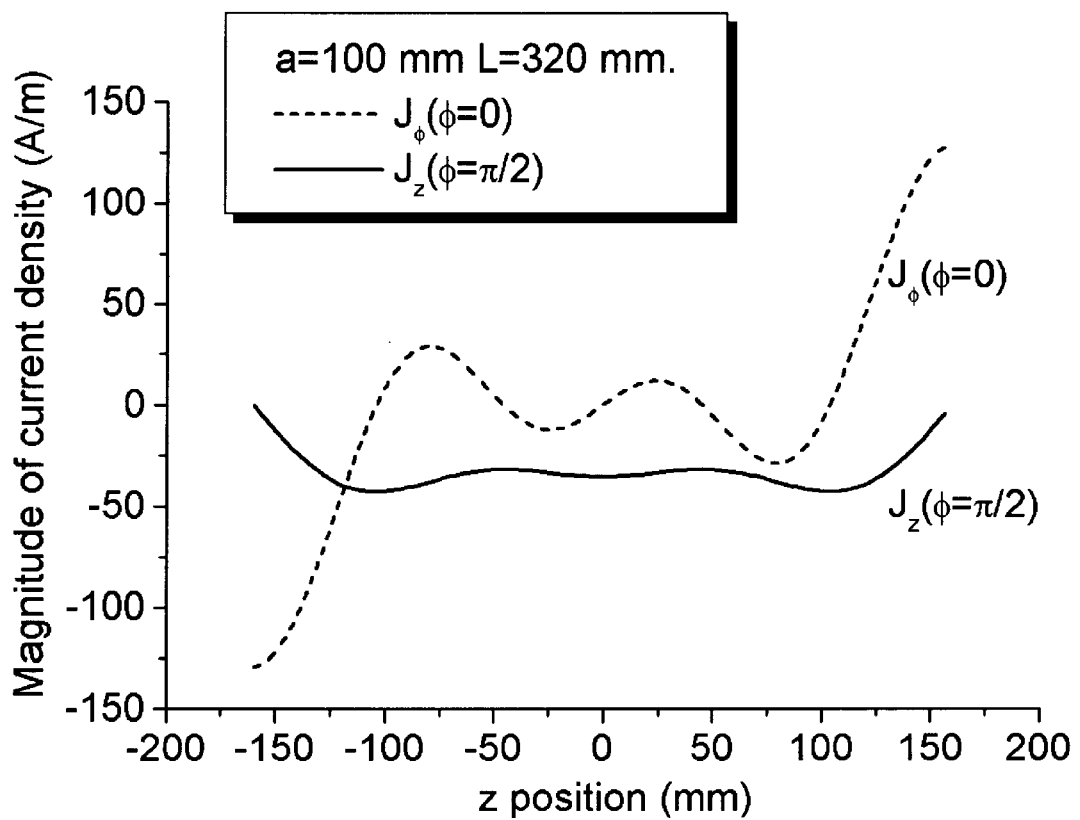
FIG. 3 shows plots of $J_\phi$ and $J_z$ along the length of a cylinder in the $\phi=0$ and $\phi=\pi/2$ planes respectively for a quasi-static formulation.

The corresponding resultant current distribution on the surface of the cylinder is shown in FIG. 2 and illustrates the current paths required for the coil. In the graph of FIG. 3, the current components $J_\phi$ and $J_z$ are plotted along the z-direction for φ=0 and φ=π/2 respectively. Contour plots (not shown) demonstrate that $B_x$ is homogeneous within the target region.

$$B_x(r) = \frac{\mu_0 aL}{2\pi\rho} \int_0^\infty \cos kz \sum_{m=1}^M J_{cm} \Psi_m(k) K'_1(ka) [k\rho \cos^2\phi I_0(k\rho) - \cos 2\phi I_1(k\rho)] dk \quad (14)$$

$$\text{where} \quad \Psi_m(k) = \frac{\sin(k-k_m)L/2}{(k-k_m)L/2} - \frac{\sin(k+k_m)L/2}{(k+k_m)L/2} \quad (15)$$

TIME HARMONIC ANALYSIS

In accordance with the invention, instead of using the quasi-static approach, a time harmonic, full wave method is used to calculate the required current density. This is essential in cases where the operating wavelength and the dimension of the cylinder are of the same order, as the prior art quasi-static method described in the above section is no longer valid. However, the mathematical derivation of a time-harmonic expression for B, in the spectral domain or an equivalent of (14) is extremely difficult. A more direct approach is to define B, directly in terms of the vector potentials of the generalized Green's function of equation (5) rather than its spectral equivalent given in equation (7):

$$B_x = \frac{\partial A_z}{\partial y} - \frac{\partial A_y}{\partial z} \tag{17}$$

where $A_z$ are $A_y$ are the vector potentials calculated from equation (4). (Note that numerically, the calculation of equation (17) is carried out using a Gaussian-Quadrature integration routine over the prescribed 2-D cylindrical surface integral.)

In the time-harmonic case, the wavelength or frequency of operation is taken into account and the wavenumber ($k_0$) is non-zero. This leads in many instances to the current density and its constituent coefficients being complex (that is, consisting of both real and imaginary components). In accordance with the invention, the calculated current densities for the generation of specific transverse RF fields are such complex quantities.

To illustrate the use of complex current densities, current densities were calculated on the same cylinder as the quasi-static example discussed above at three different frequencies: 190 MHz, 300 MHz and 500 MHz. The same target field was used, i.e., the homogeneous volume was symmetrically located. Equation (16) was modified to include complex current densities and a complex version of the matrix [T] was obtained using equation (17). The solution for [J] then follows the same procedures for the quasi-static example except that complex quantities are now included. The calculated current coefficients are shown in the following table:

TABLE 1

Computed current coefficients (M = 3) at different frequencies.

| Frequency (MHz) | $J_{c1}$ | $J_{c2}$ | $J_{c3}$ |
|---|---|---|---|
| 190 | 38.6895 + j1.9310 | −42.7225 − j2.1026 | 35.0854 + j1.6609 |
| 300 | 33.4992 + j5.4433 | −36.6628 − j5.7392 | 35.1309 + j4.9677 |
| 500 | 23.8764 + j13.0168 | −25.3327 − j12.4308 | 39.07675 + j14.0778 |

From the above table, it is clear that as the frequency increases, the imaginary part of the current densities becomes larger.

BASIS FUNCTIONS FOR ASYMMETRIC SYSTEMS

In a preferred embodiment of the invention, open-ended asymmetric structures are designed for a time harmonic system. For the design of asymmetric coil structures, surface current densities (Amp/meter) on a cylinder are defined in the same manner as for symmetric structures:

$$J(r) = J_\phi(\phi, z)\hat{\phi} + J_z(\phi, z)\hat{z} \text{ for } \rho = a \text{ and } -L/2 \leq z \leq L/2 \tag{18}$$

The relationship between $J_z$ and $J_\phi$, under mild coil length/wavelength ratios, may be approximated as:

$$J_\phi(\phi, z) = -a \int \frac{dJ_z}{dz} d\phi \tag{19}$$

Or alternately $J_z$ and $J_\phi$ may be decoupled and treated individually for the purposes of optimization. Currents on the coil are descretized along z and are represented by sub-domain basis functions.

For asymmetric structures a new set of basis functions must be specified, and in one embodiment $J_z$ and $J_\phi$ are written as a summation of triangular $T_z(\ )$ and pulse $\Pi_z(\ )$ functions respectively as follows:

$$J_z(\phi, z) = \cos\phi \sum_{m=1}^{M} J_{cm} T_z(z - z_m) \tag{20}$$

$$J_\phi(\phi, z) = \frac{a}{l_z}\sin\phi \sum_{n=1}^{M} -J_{cm}\{\Pi_z(z - z_m^+) - \Pi_z(z - z_m^-)\} \tag{21}$$

where the $J_{cm}$ are the current coefficients and $$T_z(z - z_m) = \begin{cases} 1 - |z - z_m|/l_z |z - z_m| < l_z \\ 0 \text{ elsewhere} \end{cases} \tag{22}$$

$$\Pi_z(z - z_m^\pm) = \begin{cases} 1 |z - z_m^\pm| < l_z/2 \\ 0 \text{ elsewhere} \end{cases} \text{ and}$$

$$z_m = ml_z - \frac{L}{2}, z_m^\pm = \left(m \pm \frac{1}{2}\right)l_z - \frac{L}{2} \text{ and } l_z = L/(M+1). \tag{23}$$

Magnetic fields are expressed in terms of magnetic vector potentials defined as the convolution of surface current density with the corresponding Green's function in the spatial domain:

$$A(r) = \frac{\mu_0 a}{4\pi} \int_{-L/2}^{L/2} \int_0^{2\pi} G(r|r')J(r')d\phi' dz' \text{ for } \rho = a \tag{24}$$

As previously, the corresponding generalized Green's function in cartesian coordinates is:

$$G(r|r') = \frac{e^{-jk_0|r-r'|}}{|r-r'|} \tag{25}$$

where r and r' are once again the position vectors of field and source points respectively; $k_0$ is the wave-number given by $k_0 = 2\pi/\lambda_0$; and $\lambda_0$ and is the free-space wavelength of the propagating field.

The transverse field is written as:

$$B_x = \frac{\partial A_z}{\partial y} - \frac{\partial A_y}{\partial z} \tag{26}$$

where $A_z$ are $A_y$ are the vector potentials calculated by equation (24).

In accordance with the invention, the homogeneous field is preferably asymmetrical about the z=0 plane. The target region is defined as a spherical volume of radius R centered at $z=z_{os}$. Our first method of obtaining a set of current coefficients that produces the required homogeneity is as follows.

Let $(r_1, r_2, r_3 \ldots r_N)$ be the N field positions chosen inside the target region and $B_x(r_n)$ (n=1 \ldots N) be the magnetic field at these points. The field at each target point is expressed in terms of M number of current coefficients as follows:

$$B_x(r_n) = \sum_{m=1}^{M} C_{mn} J_{cm} \quad (27)$$

where $C_{mn}$ represents the field contribution at r, due to the basis function at $z=z_m$.

The residue ($R_n$) is defined to be the difference between $B_x(r_n)$ and the specified target field $B_{xt}$, i.e., $$R_n(J_1, J_2, \ldots J_N) = B_x(r_n) - B_{xt}, n=1 \ldots N \quad (28)$$

A function $f$ is defined as:

$$f(J_1, J_2 \ldots J_N) = \sum_{n=1}^{N} R_n^2(J_1, J_2 \ldots J_N) \quad (29)$$

In order to suppress large current variations in the solution, it is sometimes useful to also include the change of current amplitude as a constrained condition. In this case a term $$w \sum_{i=1}^{N-1} m_i$$

is added to equation (28), where $m_i$ is the difference between the adjacent current elements given by $m_i = J_i - J_{i+1}$; w is the weight used for bringing $m_i$ to the same order of magnitude as $R_n$.

Our task is to find a set of $\{J_1, J_2 \ldots J_M\}$ such that $f$ is minimum, or $f_{mm} = \min\{f(J_1 J_2 \ldots J_M)\}$. There are various ways in which this function may be minimized. In one embodiment, a linear steepest descent method is used for each variable. An advantage of using this minimization technique is that it allows either a real or a complex solution to be readily obtained.

EXAMPLES OF THE FIRST METHOD ASPECT OF THE INVENTION

Examples of the invention, designed using the time harmonic, full wave method of the first method aspect of the invention are now detailed.

A coil of dimension: $\alpha=100$ mm, $L=320$ mm was designed at different frequencies: 0 MHz, 190 MHz and 300 MHz. A set of target points ($r_n$) was defined in spherical coordinates with respect to $z_{os}$, where in terms of the parameters of FIG. 1, $|z_{os}| + |D| = L/2$. The radial positions of these points were $r_n = 53.3$ mm; their angular positions are given in the following table:

TABLE 2

Angular positions of target points in spherical coordinates centered at $z_{os}$.

| N | φ | θ |
|---|---|---|
| 1 | 0° | 0° |
| 2 | 45° | 0° |
| 3 | 90° | 0° |
| 4 | 45° | 30° |
| 5 | 0° | 45° |
| 6 | 45° | 45° |
| 7 | 45° | 60° |
| 8 | 0° | 90° |

TABLE 2-continued

Angular positions of target points in spherical coordinates centered at $z_{os}$.

| N | φ | θ |
|---|---|---|
| 9 | 90° | 90° |
| 10 | 45° | 120° |
| 11 | 45° | 135° |
| 12 | 45° | 150° |
| 13 | 0° | 180° |

The specified target field was $B_{xt}=23.5$ μT. The requirement for homogeneity was specified as: max $(B_x)$−min$(B_x)$ <5% inside a spherical region of radius R≈0.7α for $z_{os}=20$ mm and R≈0.55α for $z_{os}=50$ mm. Eight current coefficients (M) were used for each computation. Tables 3 to 5 show the calculated current coefficients for the different $z_{os}$ values at the three operating frequencies. For the non-static cases, the real (Re) and imaginary (Im) components of the complex currents are shown separately. These coefficients are for use with the triangular and pulse functions discussed above.

TABLE 3

Computed current coefficients (M = 8) for quasi-static case.

| $Z_{os}$ | $J_{c1}$ | $J_{c2}$ | $J_{c3}$ | $J_{c4}$ |
|---|---|---|---|---|
| 20 mm | 220.68 | −188.62 | −7.60 | −42.38 |
| 50 mm | 1763.41 | −959.25 | −163.87 | −52.156 |

| $Z_{os}$ | $J_{c5}$ | $J_{c6}$ | $J_{c7}$ | $J_{c8}$ |
|---|---|---|---|---|
| 20 mm | −29.62 | −36.10 | −25.10 | −62.20 |
| 50 mm | −18.58 | −35.02 | −9.71 | −69.13 |

TABLE 4

Computed complex current coefficients (M = 8) at 190 MHz.

| $Z_{os (mm)}$ | Re/Im | $J_{c1}$ | $J_{c2}$ | $J_{c3}$ | $J_{c4}$ |
|---|---|---|---|---|---|
| 20 | Re | 226.65 | −195.19 | 17.93 | −42.11 |
|  | Im | −159.73 | +71.66 | −5.96 | −4.30 |
| 50 | Re | 815.32 | −280.51 | −68.98 | 0.22 |
|  | Im | −505.05 | 167.50 | 5.94 | −2.68 |

| $Z_{os (mm)}$ | Re/Im | $J_{c5}$ | $J_{c6}$ | $J_{c7}$ | $J_{c8}$ |
|---|---|---|---|---|---|
| 20 | Re | −24.42 | −33.19 | −20.73 | −55.24 |
|  | Im | +0.65 | −1.77 | −0.79 | −1.81 |
| 50 | Re | −33.27 | −30.49 | −9.94 | −63.67 |
|  | Im | 0.21 | 0.98 | 0.47 | 0.44 |

TABLE 5

Computed complex current coefficients (M = 8) at 300 MHz.

| $Z_{os (mm)}$ | Re/Im | $J_{c1}$ | $J_{c2}$ | $J_{c3}$ | $J_{c4}$ |
|---|---|---|---|---|---|
| 20 | Re | 194.73 | — | −14.29 | −22.91 |
|  | Im | — | 117.21 | −21.10 | −1.15 |
| 50 | Re | 634.66 | −48.97 | — | 23.80 |
|  | Im | 0.92 | 3.09 | 9.78 | 4.87 |

| $Z_{os (mm)}$ | Re/Im | $J_{c5}$ | $J_{c6}$ | $J_{c7}$ | $J_{c8}$ |
|---|---|---|---|---|---|
| 20 | Re | −23.01 | −29.57 | −10.18 | −51.95 |
|  | Im | −1.32 | −4.98 | 0.61 | −10.29 |
| 50 | Re | −36.71 | −27.10 | −8.53 | −53.72 |
|  | Im | 4.19 | 3.67 | 2.50 | 2.32 |

The transverse magnetic field ($B_x$) inside the cylinder was examined for each of the above cases. Computed results show that the resultant $B_x$ values meet the required homogeneity for all the above cases and they show similar characteristics for a given $z_{os}$. For the 190 MHz case, the real components of the current densities $J_\phi$ and $J_z$ are plotted along the z-direction in the $\phi=0$ and $\phi=\pi/2$ planes on the graphs of FIGS. 4A and 4B which correspond to $z_{os}=20$ mm and $z_{os}=50$ mm respectively. In both cases, $J_\phi$ and $J_z$ along z are of an oscillatory nature. It is seen that both components experience a surge in magnitude near the positive end of the coil (i.e., the end closest to the end where the target region is located).

Figure 5:
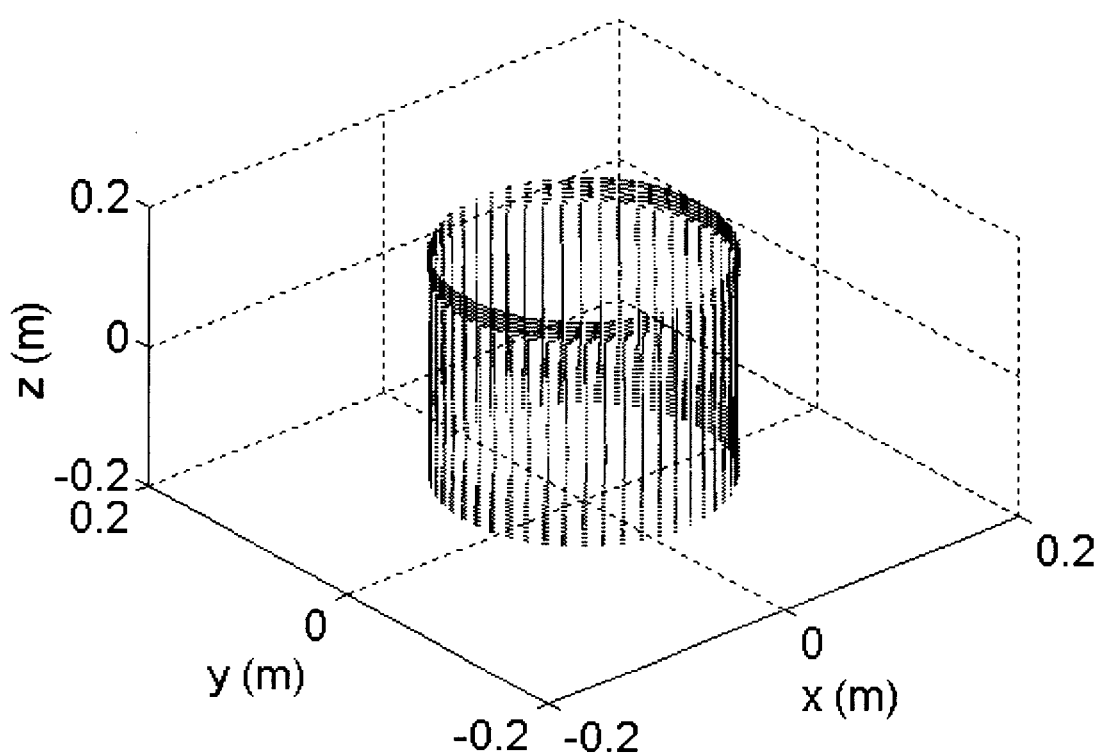
FIG. 5 shows the current distribution on the surface of a cylinder calculated from the real solution of Table 4 ($z_{os}$=20 mm; 190 MHz)
Figure 6:
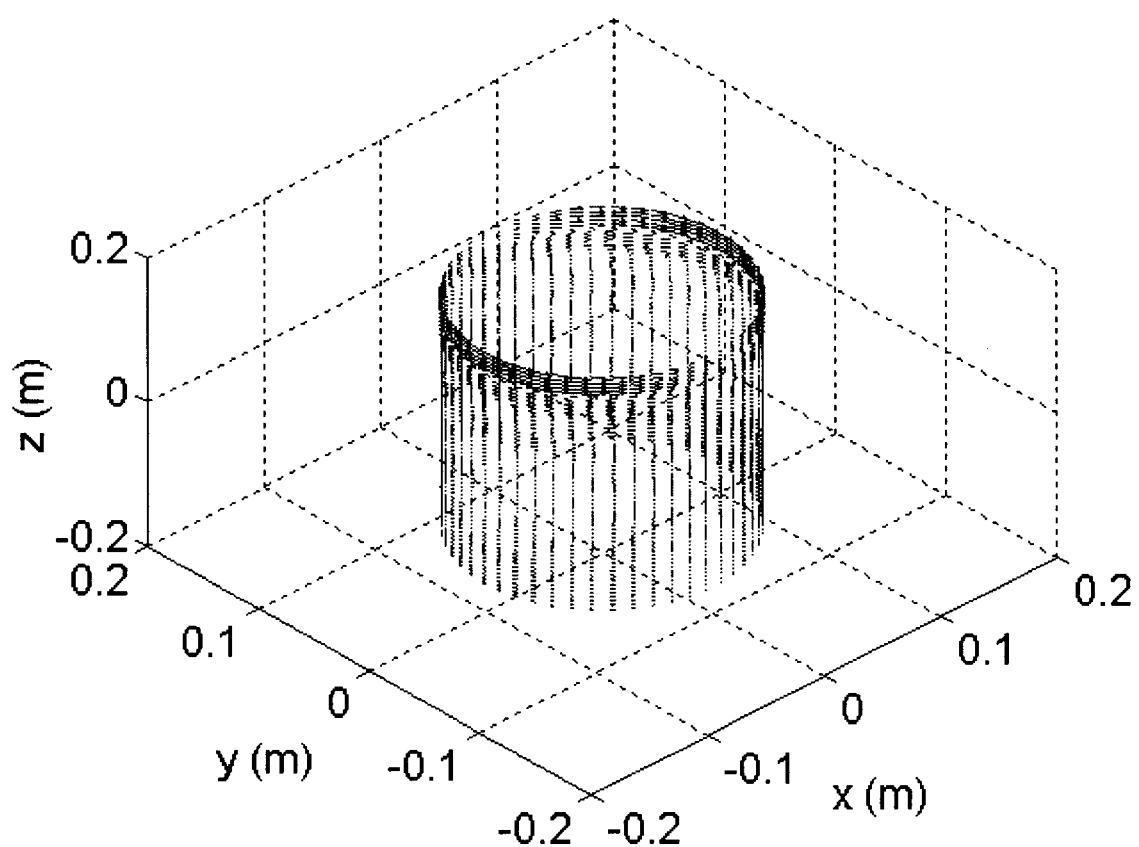
FIG. 6 shows the current distribution on the surface of a cylinder calculated from the real solution of Table 4 ($z_{os}$=50 mm; 190 MHz)

FIGS. 5 and 6 show current distributions on the surface of a cylinder from the real solutions of Table 4 for $z_{os}$ equal to 20 mm and 50 mm, respectively.

Figure 4A:
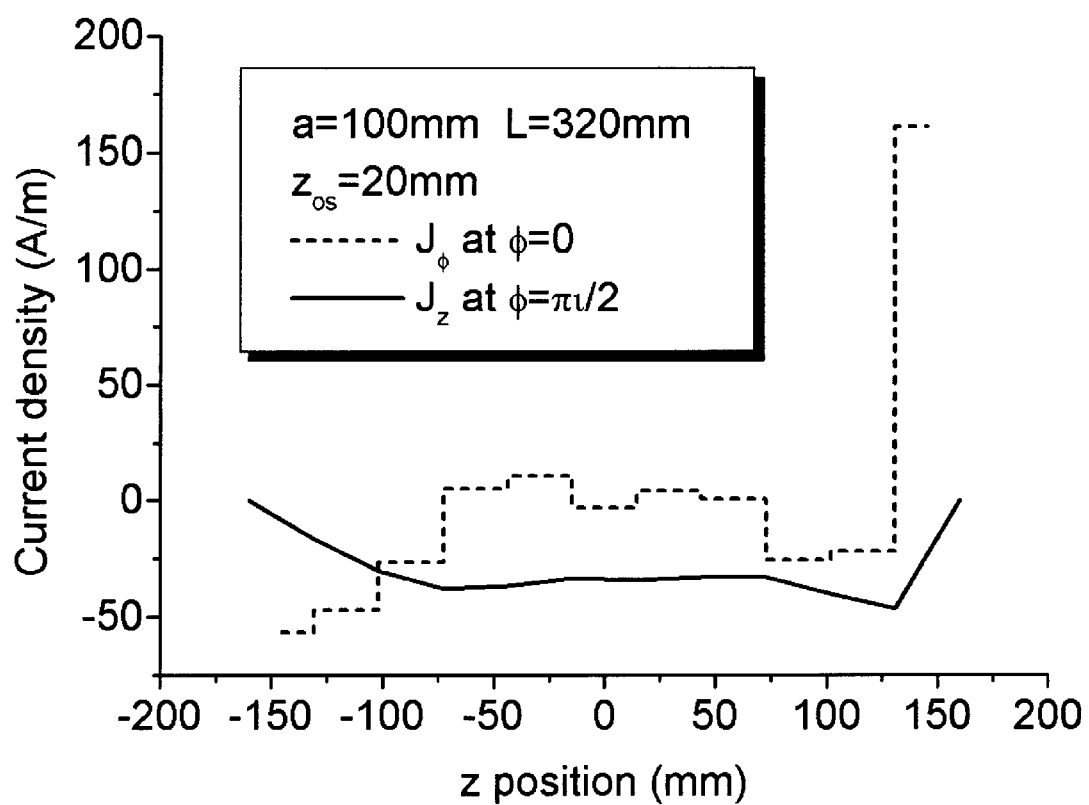
FIGS. 4A and 4B show plots of $J_\phi$ and $J_z$ along the length of a cylinder in the $\phi=0$ and $\phi=\pi/2$ planes respectively for the real solutions of Table 4 (190 MHz).
Figure 4B:
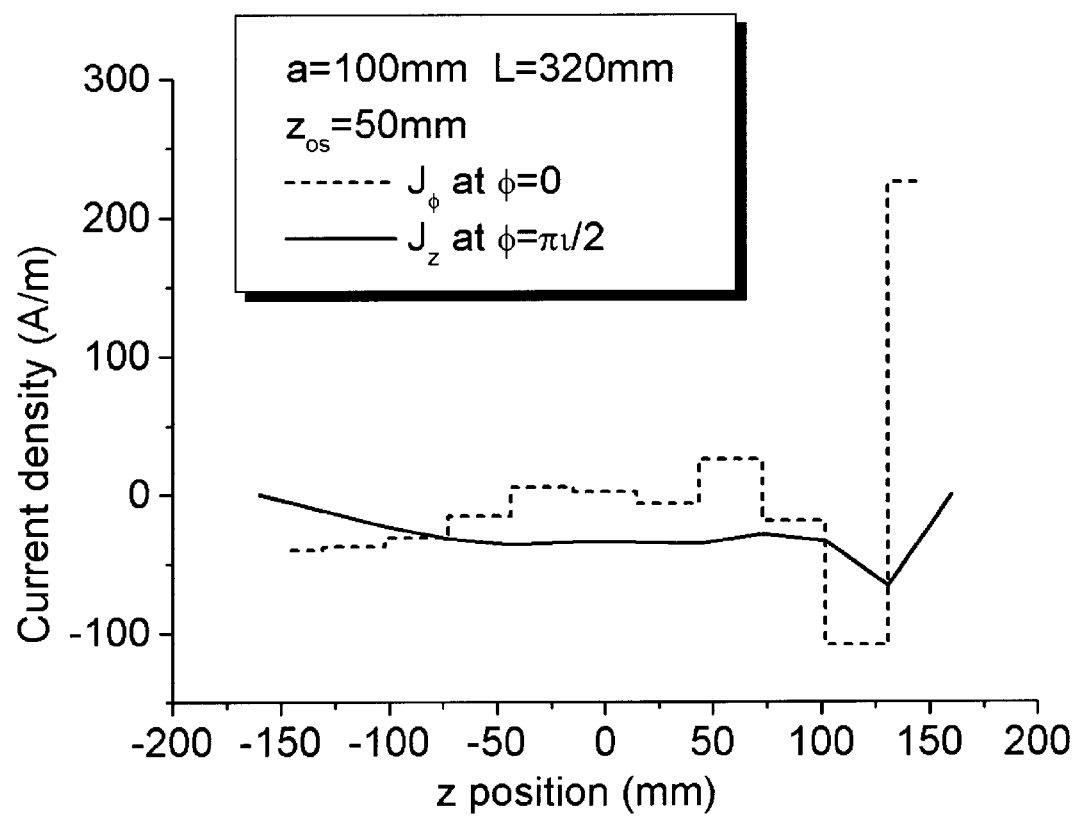

Plots of the $B_x$ field created by the currents of FIG. 4A and FIG. 4B over the volume $\rho \leq 80$ mm, $-160$ mm $\leq z \leq 160$ mm (not shown) revealed a homogeneous region in both cases that was asymmetrical about the center of the coil and satisfied the criteria for homogeneity. It was also found that there was a larger volume of homogeneity in the $z_{os}=20$ mm case than in the $z_{os}=50$ mm case.

EXAMPLES OF THE SECOND METHOD ASPECT OF THE INVENTION

As a representative illustration of the second method aspect of the invention, the following sets of basis functions are used for the current density components on the surface of a cylinder with radius $\rho_0$ (m) and length L (m):

$$J_\phi = \sum_{q=0}^{1} \sum_{p=0}^{1} \sum_{n=1}^{N} \sum_{m=p+1}^{M} a_{mnpq} \cos\left(n\phi + \frac{q\pi}{2}\right) \cos\left(k_m z + \frac{(2p-m)\pi}{2}\right) \hat{a}_\phi \quad (30)$$

$$J_z = \sum_{q=0}^{1} \sum_{p=0}^{1} \sum_{n=1}^{N} \sum_{m=p+1}^{M} c_{mnpq} \sin\left(n\phi + \frac{q\pi}{2}\right) \sin\left(k_m z + \frac{(2p-m)\pi}{2}\right) \hat{a}_z \quad (31)$$

$$\text{where } k_m = \frac{(m-p)\pi}{L} \quad (32)$$

and the complex coefficients $\alpha_{mnpq}$ and $c_{mnpq}$ are to be calculated.

This form of the basis functions was selected based on the following rationale. If the specified field has only one vector component that does not vary with $\phi$, then it can be reasoned that the $$\frac{q\pi}{2}$$

term in the basis functions is unnecessary as the axis can be set in any direction in the xy plane. However for simplicity, $\phi=0$ is set to coincide with the x-axis and the $$\frac{q\pi}{2}$$

term will be necessary for any specified field that has a y-component.

For specified fields in MRI applications, it is expected that the current density J is anti-symmetrical at 180°, so coefficients of even harmonics of $\phi$ will be zero and hence, n=1, 3, 5 . . . Both components of J have a z dependence described with $$k_m z + \frac{(2p-m)\pi}{2}$$

where p=0, 1 and m is an integer series commencing at p. The index p=0 describes basis functions that have $J_z=0$ at $z=\pm L/2$ whereas the index p=1 describes basis functions with a $J_\phi=0$ at $z=\pm L/2$.

If the specified field is symmetric with respect to the z=0 plane, then all coefficients of even m terms will equal zero and hence m can be assigned m=1, 3, 5, . . . However, all terms of m are required if the specified region is asymmetric with respect to the z=0 plane as in the example coil design presented herein.

The next step in the method is to calculate the coefficients of the basis functions in equations (30) and (31) such that a specified homogeneous field is generated. Because the time harmonic Green's functions are of a complex variable, the coefficients of the current density J are complex as well. If the specified field is that of a circularly polarized field, then the real and imaginary components would be the same albeit spatially separated by 90°. So if $J(\phi, z)$ produces $Ka_x$ in the DSV, $J(\phi-\pi/2, z)$ would produce $Ka_y$ where K is just a constant. The real part of the current that would produce a circularly polarized field is then:

$$J_{linear} = \text{real}\{J(\phi, z)\} - \text{imag}\{J(\phi-\pi/2, z)\} \quad (33)$$

and this is the same current that would produce a linearly polarized field. Hence only $B_x \hat{a}_x$ is needed to be specified in the DSV to produce $J(\phi, z)$ and (33) can be used to obtain the final current density with only a real component.

Transmitting RF coils must have a shield to prevent eddy currents in external conductors and to provide a suitable RF ground. A shield may be approximated by specifying $B=0$ on a cylinder with a radius slightly larger than the shield radius. A current is approximated on the shield by the same set of basis functions as those for the inner coil except that the shield current now has both div-free and curl-free components (see below).

If $(a^c)$ and $(c^c)$ denote column vectors of the $J_\phi$ and $J_z$ coefficients of the coil current (see equation (30)), $(a^s)$ and $(c^s)$ denote column vectors of the $J_\phi$ and $J_z$ coefficients of the shield current (see equation (31)), and $\{\sim\}$ denotes a matrix, then the field in the DSV due to the coil currents is found in matrix form, as:

$$[A](a^c)+[B](c^c)=(B_{xt}^c) \quad (34)$$

$$[C](a^s)+[D](c^s)=(B_{xt}^s) \quad (35)$$

where the summation of the vectors $(B_{xt}^c)$ and $(B_{xt}^s)$ results in the target field vector $(B_{xt})$ within the DSV. Similar matrix equations result when applying $B_x=0$, $B_y 0$ and $B_z=0$ as the condition at specified points near the outside of the surface of the shield cylinder:

$$[K](a^c)+[L](c^c)+[M](a^s)+[N](c^s)=(0) \quad (36)$$

The matrix equations are usually not square because the number of points where the magnetic field is specified does not usually equal the number of unknown coefficients. The rank of the matrices are usually less than the number of unknown coefficients as well, and so a regularization method must be used for a solution.

It should be noted that equations (34), (35), and (36) can be written in more compact form as Eq. (I) above.

REGULARIZATION

The regularization method chosen as a non-limiting example was to minimize some functional in terms of the current density and impose the extra conditions onto the matrix equations such as (34) to (36). Numerous functionals are available and it is convenient to choose a functional such that the resulting current density is easier to implement. The functional:

$$\min \int_{S_0} J \cdot J ds \qquad (37)$$

results in a current density similar to one of minimum power and hence is a useful choice. When the current density equations (30) and (31) are substituted into the above equation (37) and differentiated to find the coefficients for a minimum:

$$\int_{S_0} \frac{\partial}{\partial a_{ijkl}} (J \cdot J) ds = 0 \qquad (38)$$

$$\int_{S_0} \frac{\partial}{\partial c_{ijkl}} (J \cdot J) ds = 0 \qquad (39)$$

the resulting matrix equation is just some constant multiplied by the identity matrix. This is because the basis functions are orthogonal. For a current density with no divergence, the wire implementation depends on the stream-function n·S, where $$S = -n \sum_{q=0}^{1} \sum_{p=0}^{1} \sum_{n=1}^{N} \sum_{m=p+1}^{M} d_{mnpq} \cos\left(n\phi + \frac{q\pi}{2}\right) \sin\left(k_m z + \frac{(2p-m)\pi}{2}\right) \qquad (40)$$

where n is normal to the cylindrical surface $$d_{mnpq} = \frac{\rho_0(\rho_0 k_m a_{mnpq} + n c_{mnpq})}{n^2 + \rho_0^2 k_m^2} \qquad (41)$$

Hence minimizing the variation in S over the surface would minimize the variation in its contours that ultimately determine the wire positions:

$$\min \int_{S_0} (\nabla \cdot \nabla (n \cdot s))^2 ds \qquad (41\text{ A})$$

where $\nabla \cdot \nabla(n \cdot S)$ gives a quantitative measure of the stream-function's variation.

In this case, because the basis functions on the coil form a set with zero divergence, the $d_{mnpq}$ coefficients of S reduce to:

$$d_{mnpq} = \frac{a_{mnpq}}{k_m} \qquad (42)$$

Applying the condition (42) results in a matrix with diagonal terms:

$$[R] = \pi L \left( \frac{n'^2}{k_m \rho_0^2} + k_m \right)^2 [I] \qquad (43)$$

[R] being the regularization matrix, and [I] being the identity matrix.

MATRIX SOLUTION

An iterative method was used as a non-limiting example to calculate the coil coefficients and shield coefficients separately so that the error in each could be adjusted more exactly by adjusting two scalar penalty values $\lambda_1$ and $\lambda_2$.

Firstly, the initial coil currents were calculated using the expression:

$$(a_1{}^C) = ([A']^T[A'] + \lambda_1[R_1])^{-1}[A']^T(B_{xt}) \qquad (44)$$

where [A'] is the combination of [A] and [B] of (34) using the relationship of equation (42) and [$R_1$] is the regularization matrix calculated by applying (37) to the coil currents.

The field very close to the shield due solely to the coil currents is:

$$(b_{S/C}) = [K'](a_1{}^C) \qquad (45)$$

where [K'] is the combination of [K] and [L] of (36). Shield currents are calculated to negate this field:

$$(s) = -([M']^T[M'] + \lambda_2[R_2])^{-1}[M']^T(b_{S/C}) \qquad (46)$$

where $(s)^T = ((a^S)^T \, (c^S)^T)$, $[M'] = [[M] \, [N]]$ of (36) and [$R_2$] is the regularization matrix calculated by applying (37) to the shield currents. The field in the DSV due to the shield currents is:

$$(b_{DSV/S}) = [C'](s) \qquad (47)$$

where [C'] = [[C] [D]] of (35). The field in the DSV due to the coil currents is:

$$(b_{DSV/C}) = [A'](a_1{}^C) \qquad (48)$$

The error in the DSV is then:

$$(b_e) = (B_{xt}) - (b_{DSV/C}) - (b_{DSV/S}) \qquad (49)$$

The new coil coefficient estimate is:

$$(a_{1+1}{}^C) = (a_1{}^C) + ([A']^T[A'] + \lambda_1[R_1])^{-1}[A']^T(b_e) \qquad (50)$$

The calculation then loops back to (45) and is terminated when the difference in the error between two consecutive iterations falls below a certain predefined limit (e.g., 0.01). The error $\epsilon_{DSV}$ here is defined as:

$$\varepsilon_{DSV} = \frac{|(b_\varepsilon)|}{|(b_{xi})|} \qquad (51)$$

and the shield error $\epsilon_S$ is defined as the error in the field produced outside the shield:

$$\epsilon_S = |b_{S/C} + [M'](s)| \qquad (52)$$

The penalty scalars $\lambda_1$ and $\lambda_2$ affect the current density solution as well as determining the condition of the matrices to be inverted in equations (44), (46) and (50). Typically, the matrix problem becomes unstable (that is, where the matrix is tending towards being singular) below a certain value of $\lambda$.

EXAMPLES ILLUSTRATING THE ASPECTS OF THE INVENTION IN WHICH CURRENT DENSITIES ARE CONVERTED TO DISCRETE COIL STRUCTURES

By whatever method the complex current density functions are obtained, the next step in the process of the overall design method is to synthesize the coil structure form the current density.

In a preferred embodiment, a stream function method is employed to calculate the positions and dimensions of conductors such that the stream function of the current distribution in the conductors closely approximates the stream function of the calculated current density.

QUASI-STATIC CASE

It can be seen from equations (2) and (3) that the divergence of the quasi-static current density is zero:

$$\nabla \cdot J = 0 \tag{53}$$

In true electromagnetic systems, the divergence is not zero but:

$$\nabla \cdot J = -j\psi \rho \tag{54}$$

where $\rho$ is the charge density. However, for this analysis, the charge distribution is assumed to be negligible, which is true for static and low frequency systems.

Because of zero divergence, a function S can be calculated that represents the magnetic flux produced from the current density as:

$$\nabla \times S = J \tag{55}$$

where from equations (2) and (3):

$$S = -n\cos\phi \sum_{m=1}^{M} \frac{c_m}{k_m} \cos k_m z \tag{56}$$

where n is the radial unit vector and is normal to the cylindrical surface. Note that if J is a surface current density, S will only have a component perpendicular to the surface containing J, and hence only the magnitude of S is needed. The magnitude of S is a function in two dimensions.

The current distribution in the conductors should be such that it produces the same function S as that produced by the calculated current density J. This is done by finding the contours of n·S and generating appropriate currents in each of the wires placed in the positions of the contours. If the contour 'heights' are chosen at equal increments between minimum and maximum, the currents in each of the wires following the contours should be equal. If the contour 'heights' are not equally spaced, the currents in the wires have to generated accordingly in proportion to the contour spacing.

By way of an example, consider equation (56) with six real coefficients (M=6): $c_m$=47.3518, 212.791, 314.615, 687.005, −3946.81 and 5365.36.

The values of the stream function dictates the shape and position of the contours and hence, is decided iteratively by investigating the electromagnetic simulations each contour configuration produces. For example, the contours may be taken at equal fractions of the stream-function's maximum value, resulting in equal current in all the wires. Alternatively, if the maximum is normalized to one, contours could be taken at ±0.697, ±0.394 and ±0.091. Because the interval (0.091) between zero and n·S=0.091 does not equal the interval (0.303) between n·S=0.091 and n·S=0.394, the current in the lowest 0.091 contour will have to be 0.3 (i.e., 0.091/0.303) of the current flowing in the 0.394 contour and 0.697 contour (these two contours should have equal current).

The next task is to derive a workable model from these contours.

Design decisions in this process include:

1. A magnetic symmetry plane at $\phi=0$ is used for the stream function in the range $-L/2<z<L/2$ and $\pi<\phi<\pi$.
2. Each contour is implemented as a conductor. Two cases were examined: one where the conductors are implemented as circular wires (tubes) of specified diameter and the other where the conductors are implemented as metal strips of specified width. The diameter or width of a conductor determines its self-inductance and hence its complex impedance. It is possible to adjust the current levels in the conductors by adjusting the diameter or width of the conductors accordingly.
3. The contours are connected depending on the sign of the stream function. If two contours are in close proximity and the stream function value has the same sign for both contours, then the contours are connected in parallel. If the contours have a stream function value of differing sign, the contours are connected in series.
4. Capacitors are added at the connections of the contours connected in series and also at the mid-point of contours that are not connected to other conductors. However, there is a freedom to add capacitors wherever the designer considers suitable. The values of the capacitors are determined from an iterative approach using repeated frequency sweeps in the device simulation.
5. The source points are at the extreme ends of the contour, that is, either at both ends or at one end: either at z=L/2 and z=−L/2 or only at z=L/2.

Figure 7:
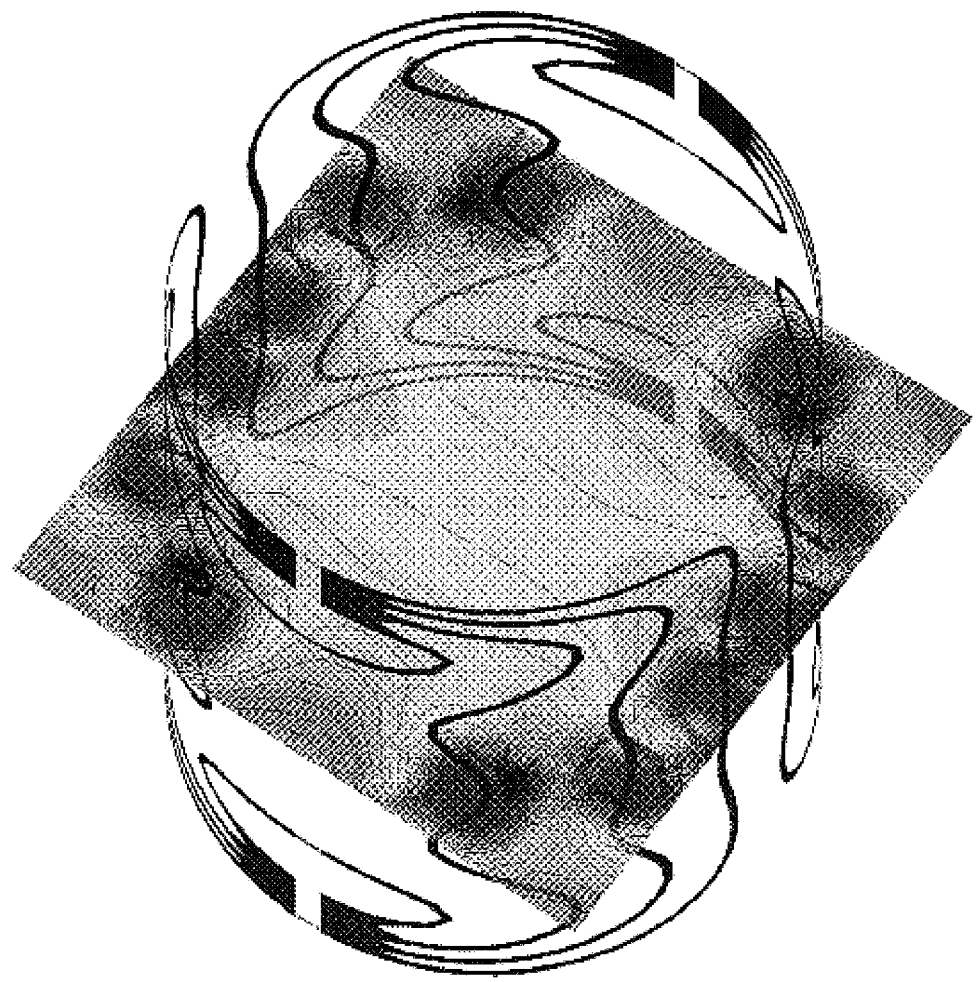
FIG. 7 shows a full conductor model of the contours of the symmetric current density distribution shown in FIG. 3.

A full implementation of this method results in the conductor configuration shown in FIG. 7 for the current density defined by the six real coefficients set forth above, i.e., $c_m$=47.3518, 212.791, 314.615, 687.005, −3946.81 and 5365.36.

In a preferred embodiment, asymmetric structures are synthesized.

When triangular basis functions are employed to approximate the current density, only the current-density values are provided at points within the domain of each triangular function. Thus the problem is to find the appropriate contours of a two-dimensional grid-like data set that will best approximate the current density that the data set is meant to represent. In the quasi-static problem, the current density has zero divergence because of the nature of the basis functions and thus the electric field at the surface is parallel with the current density. In the non-quasi-static case however, the electric field can have a component perpendicular to the current density and so an approach has to include measures for the approximation of the charge density. In accordance with the preferred embodiments of the invention, the curl-free and divergence-free components of the current density are found separately and each is approximated in turn.

CURRENT-DENSITY COMPONENTS

The current density J can be split into its curl-free and divergence-free components by writing:

$$J = \nabla \times S + \nabla \psi \tag{57}$$

From Laplace's law, it follows that $$\nabla^2 \psi = \nabla \cdot J \tag{58}$$

and the curl-free component of J is:

$$J_{curl-free} = \nabla \psi \tag{59}$$

The divergence-free component can be found by applying curl to both sides of equation (57) to give:

$$\nabla \times \nabla \times S = \nabla \times J$$

If the divergence of S is made zero:

$$\nabla \cdot S = 0$$

then:

$$-\nabla^2 S = \nabla \times J \tag{60}$$

The divergence-free component is:

$$J_{div-free} = \nabla \times S \quad (61)$$

Since $J_{div-free}$ is only on the surface, and to be free of singularities in the differentiation normal to a surface, it is best if $$n \times S = 0$$

Hence, (60) also becomes a Poisson equation over the surface of J:

$$-\nabla^2(n \cdot S) = n \cdot \nabla \times J \quad (62)$$

The task then is to solve the two Poisson equations (58) and (62) for ψ and n·S and thereby using the contours of ψ and the contours of n·S to approximate the entire current density J.

Note that $J_{div-free}$ is the current density that directly influences the magnetic field tangential to the surface of the conductor. $J_{curl-free}$ is a measure of the quantity of rate of change of charge density and this quantity directly influences the electric field normal to the surface. In other words, $J_{div-free}$ can be thought of as the inductive component of the circuit and $J_{curl-free}$ as the capacitive component of the circuit.

Once S and ψ are calculated, the contours and configuration of the coils can be designed. The contours of n·S dictate the current configuration. Once n·S is found, its contours and hence the coil pattern can be calculated in a similar manner to the quasi-static case.

Figure 8:
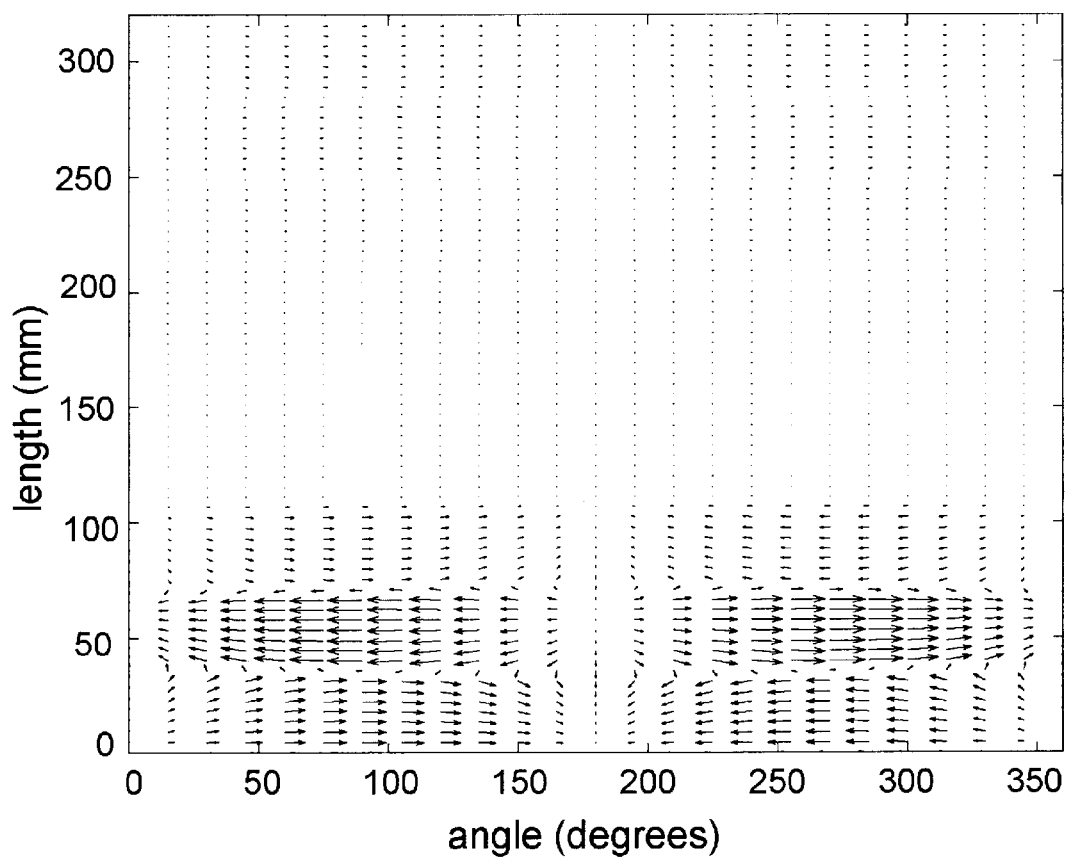
FIG. 8 shows a current density distribution for a 320 mm length coil with radius 100 mm having a homogeneous volume 50 mm from the center of the coil towards the coil's lower end.
Figure 9:
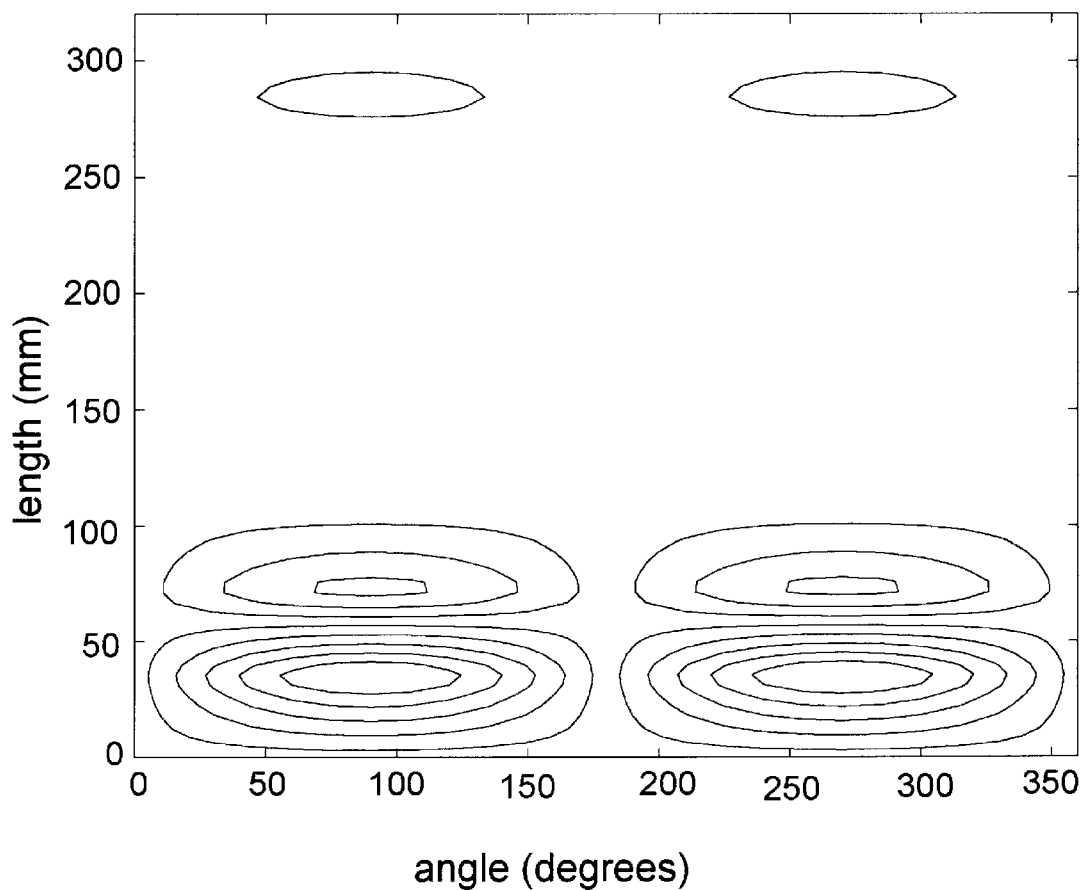
FIG. 9 shows contour lines for n·S for the current density of FIG. 8.
Figure 10:
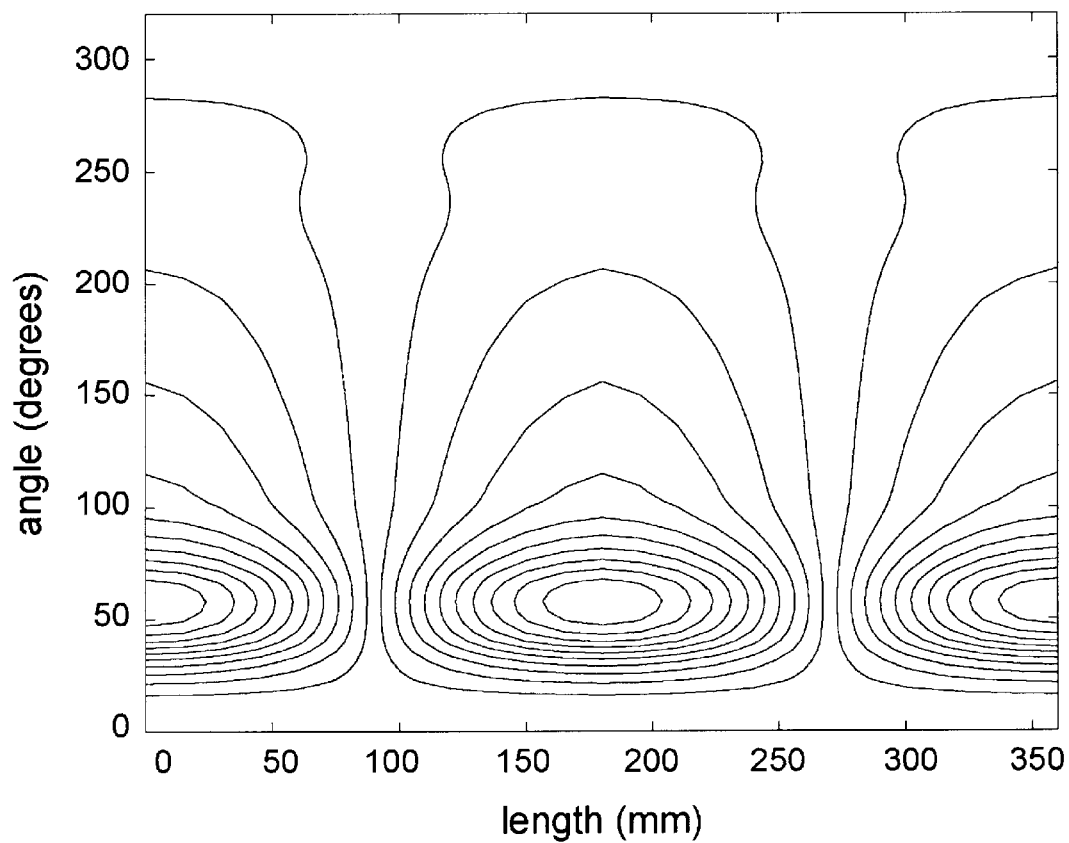
FIG. 10 shows contour lines for $\psi$ for the current density of FIG. 8.

As examples of the above procedures, FIGS. 9 and 10 show the results of determining inductive and capacitive elements for complex current density functions obtained using the first method aspect of the invention and shown in FIG. 8. The coil had a homogeneous region 50 mm from the center towards the lower end; the length of the coil was 320 mm and its radius was 100 mm. The operating frequency was 190 MHz.

A contour diagram of n·S is plotted in FIG. 9 and demonstrates the paths for the conducting strips and/or wires. The contours of ψ will be demarcation curves of varying areas of capacitance.

One mechanism to increase capacitance is to make an RF shield a contoured surface rather than just a cylindrical sheet, such that at regions of higher capacitance, the shield is closer to the coil than at regions where the capacitance is lower. Another mechanism is to add dielectric material of high permittivity at regions of higher capacitance compared to other regions, varying according to ψ.

FIG. 10 shows a contour plot of ψ for the same current density as shown in FIG. 8. The contours in this case are not current paths but are markers to indicate the regions of increasing charge density and hence capacitance. The region of highest capacitive effect is in the center of the contours. Note that $J_{curl-free}$ is actually perpendicular to these contour lines.

As further examples of the above procedures, FIGS. 11 through 15 show the results of determining inductive and capacitive elements for complex current density functions obtained using the second method aspect of the invention.

The design objective was to produce an RF coil 20 cm in diameter, 25 cm in length with a DSV diameter of 10 cm, offset by 2.5 cm from the $z=0$ plane. (The $z=0$ plane passes half-way along the length of the coil). The coil was designed at the frequency of 190 MHz such that it could be tested in an available MRI machine.

Figure 11:
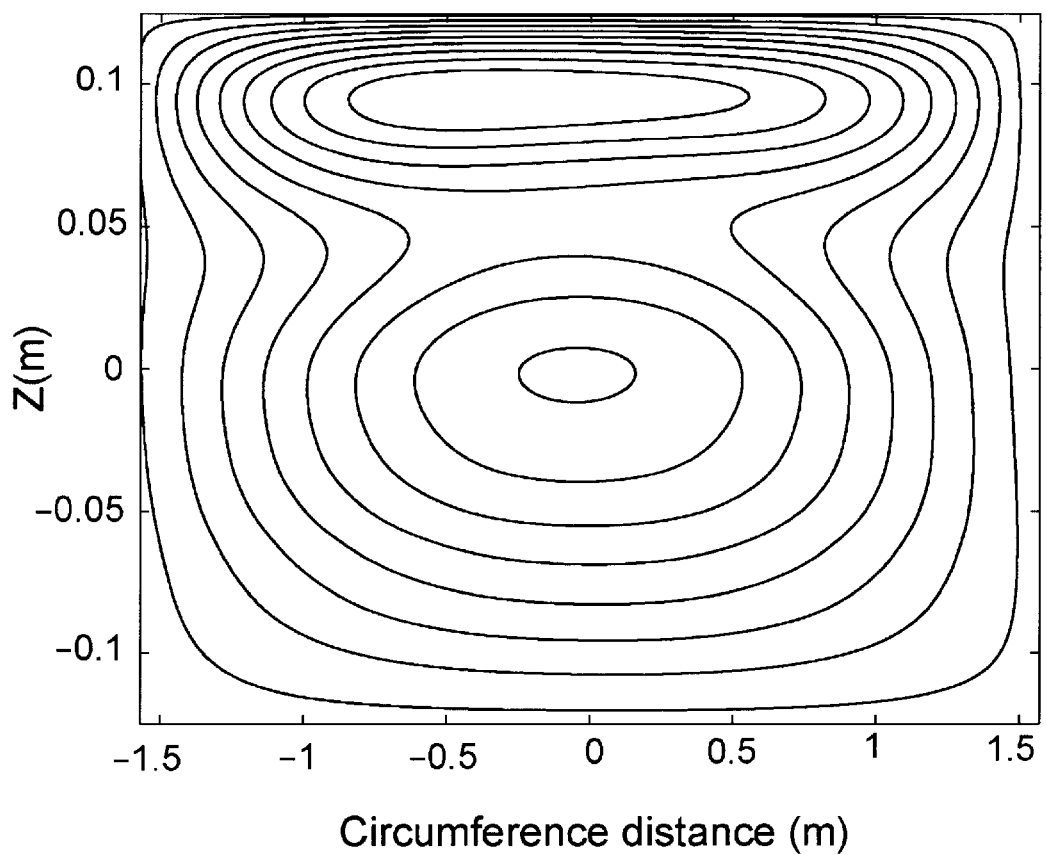
FIG. 11 shows the contour lines for the stream function n·S calculated using the second method aspect of the invention.
Figure 12:
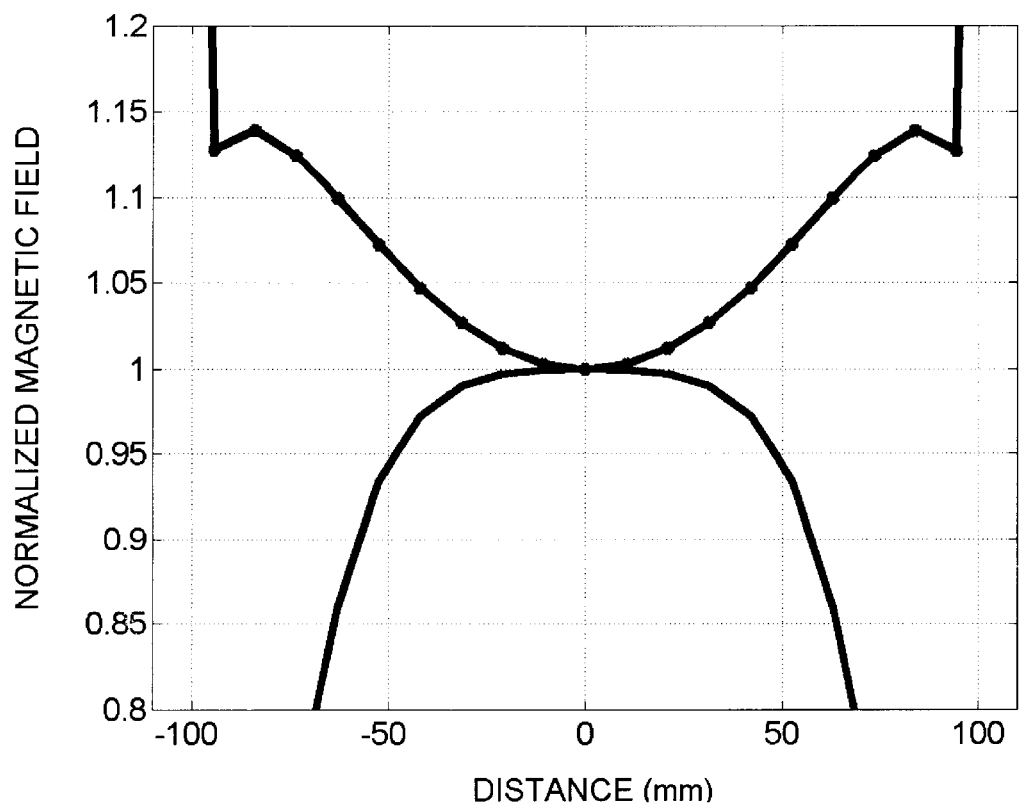
FIG. 12 shows a normalized magnetic field for a representative asymmetric coil in the transverse plane determined using the second method aspect of the invention. The upper curve shows the distribution in the x direction and the lower curve shows the distribution in the y direction.
Figure 13:
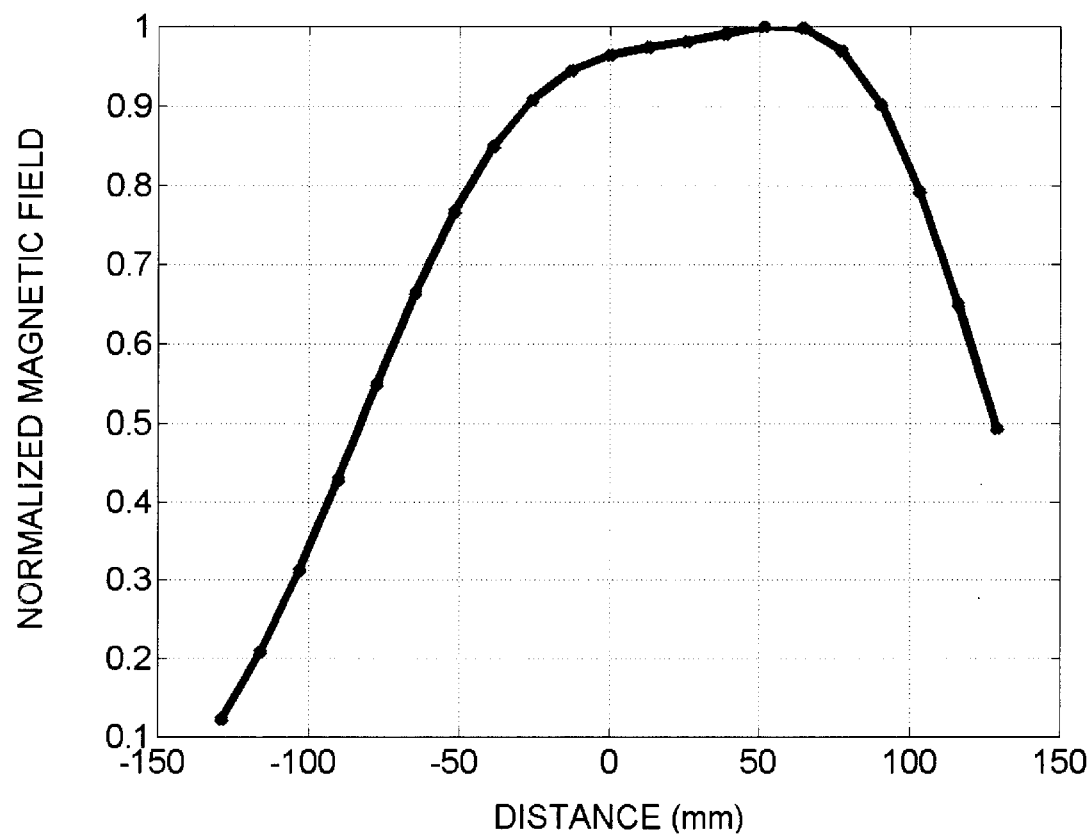
FIG. 13 shows a transverse magnetic field along the z-axis for a representative asymmetric coil determined using the second method aspect of the invention.
Figure 14:
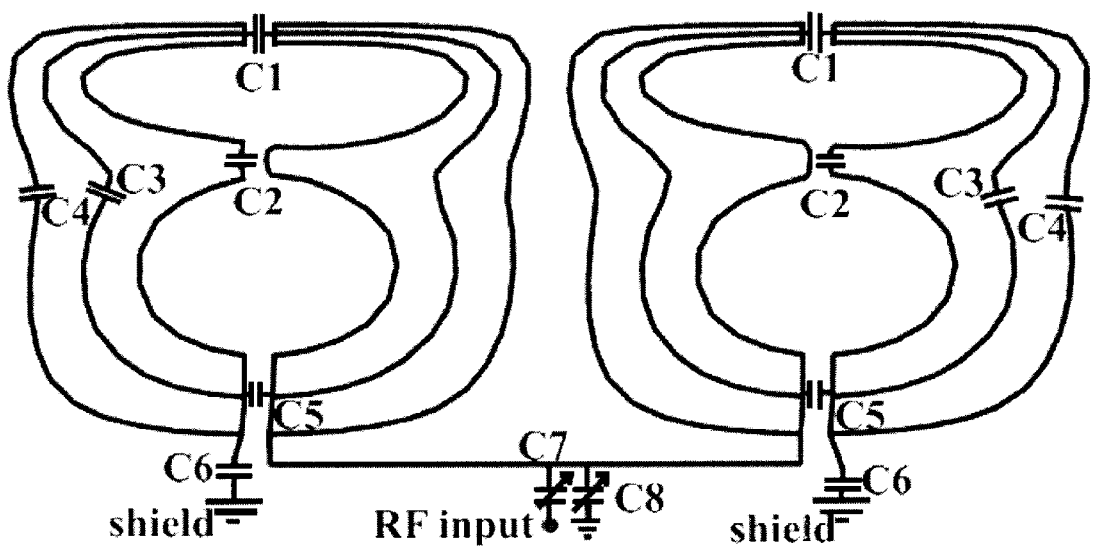
FIG. 14 is a circuit-type layout for a representative asymmetric coil.

The second method of the invention was used with the constraint that $J_z=0$ at $z=\pm L/2$. This constraint is a factor on how the resulting coil is excited because no current distribution flows out from the edge of the cylinder. After obtaining coefficients of the current density, the function S was calculated. The contours of the stream function n·S for half the coil are shown in FIG. 11. These are the preliminary patterns for conductor positions. The resulting current density was tested using a commercial method of moments package (e.g., the FEKO program distributed by EM Software & Systems, South Africa). The coil current density is approximated by Hertzian dipoles while the shield current density is ignored. Instead, a metallic shield approximated by triangles as per the method of moments is positioned where the shield should be. The normalized magnetic field of the coil in the transverse (x,y) plane is shown in FIG. 12. The field varies within 10% over a distance of 13 cm in the x-direction (upper curve) and 12 cm in the y-direction (lower curve). The field variation along the z-axis is shown in FIG. 13 which shows a 10% variation over a distance of 11 cm shifted along the z-axis by 2.5 cm. These simulated results generated by Hertzian dipoles approximating coil currents and a metal cylinder for the shield agree with the original field specification and target volume specification in the inverse program.

Figure 15:
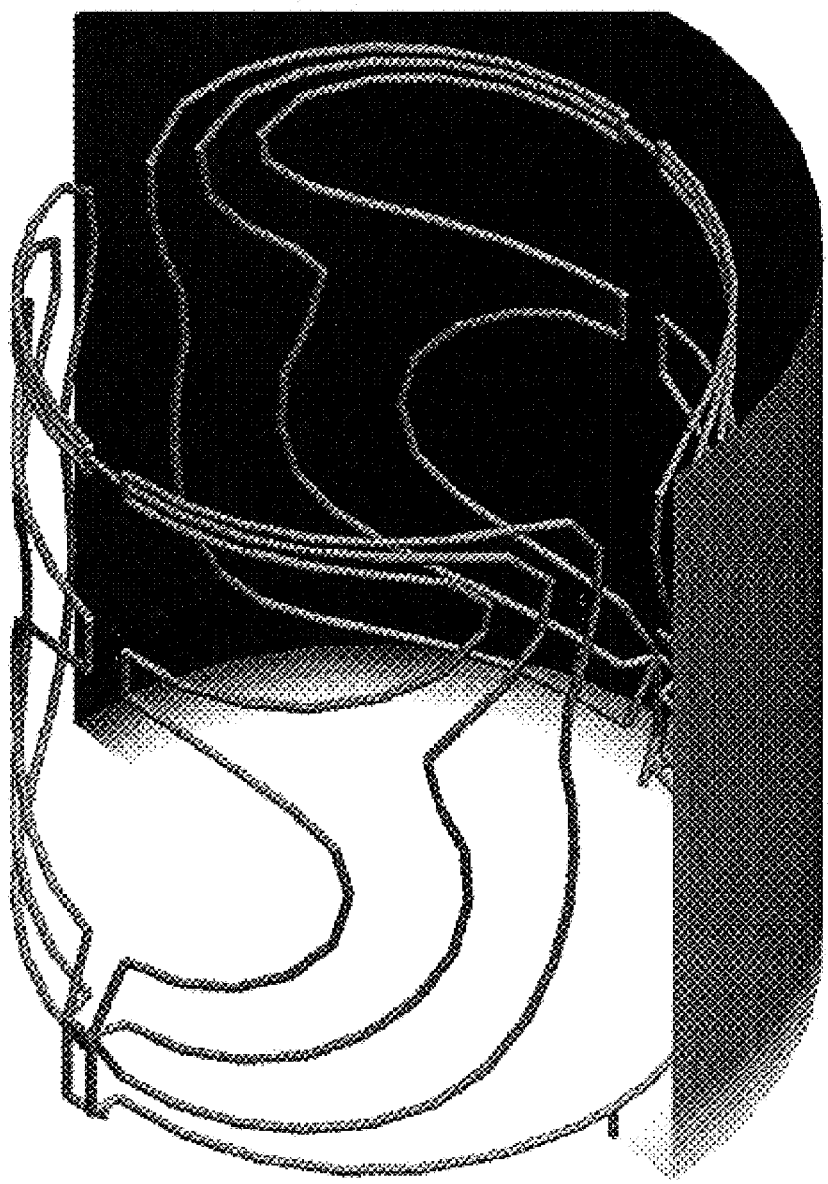
FIG. 15 is a 3D perspective of an inductive geometry for a representative asymmetric coil. A partial shield is included for illustrative purposes.

The coil patterns were then converted to conductor patterns. For this case, 2.2 mm diameter wires were used for the conducting paths. Lumped elements were added to the model and adjusted such that the current distribution at the resonant frequency of 190 MHz approximated the original calculated current distribution. The resulting coil is shown in FIG. 15 with the circuit diagram shown in FIG. 14. The values for the capacitors are: C1=3.9 pF, C2=4.7 pF, C3=3.3 pF, C4=2.7 pF, C5=2.2 pF, C6=10 pF and C7 and C8 are variable capacitors.

When the coil was constructed, it realized an unloaded Q of 139, measured from the 3 dB down power points either side of the resonant frequency In all of the examples presented throughout this specification, a homogenous target field has been specified, but non-homogeneous target fields may be required in some circumstances and these are readily handled by the methodology disclosed herein.

The invention has been described with particular reference to asymmetric radio frequency coils and a method for designing such coils, in which the section of interest (the DSV) can be placed at an arbitrary location within the coil. It will also be understood by those skilled in the art that various changes in form and detail may be made without departing from the spirit and scope of this invention.

What is claimed is:

1. Apparatus for use in a magnetic resonance system for transmitting a radio frequency field, receiving a magnetic resonance signal, or transmitting a radio frequency field and receiving a magnetic resonance signal, said apparatus and said magnetic resonance imaging system having a common longitudinal axis, said apparatus comprising:
    (a) a support member which defines a bore having first and second open ends which are spaced from one another along the longitudinal axis by a distance L; and
    (b) a plurality of inductive elements and a plurality of capacitive elements associated with the support member;
    wherein if used as a transmitter, the apparatus has the following characteristics:
        (i) the apparatus produces a radio frequency field which has a radial magnetic component which has a spatially-varying peak magnitude whose average value is $A_{r-avg}$;

(ii) the apparatus has a homogenous volume within the bore over which the spatially-varying peak magnitude of the radio frequency field has a maximum deviation from $A_{r\text{-}avg}$ which is less than or equal to 15%;

(iii) the homogeneous volume defines a midpoint M which is on the longitudinal axis, is closer to the first end than to the second end, and is spaced from the first end by a distance D such that the ratio D/L is less than or equal to 0.4; and (iv) at least one of said inductive elements comprises a discrete conductor which follows a sinuous path such that during use of the apparatus current flows through a first part of the conductor in a first direction that has both longitudinal and azimuthal components and through a second part of the conductor in a second direction that has both longitudinal and azimuthal components, said first and second directions being different.

2. The apparatus of claim 1 wherein said first and second open ends have transverse cross-sectional areas $A_1$ and $A_2$, respectively, which satisfy the relationship:

$|A_1 - A_2|/A_1 < 0.1$.

3. The apparatus of claim 2 wherein $A_1$ is at least $2 \times 10^3$ cm$^2$.

4. The apparatus of claim 1 wherein the bore is cylindrical.

5. The apparatus of claim 1 wherein the homogenous volume is at least $30 \times 10^3$ cm$^3$.

6. The apparatus of claim 5 wherein L is at least 1.0 meter.

7. The apparatus of claim 1 wherein the spatially-varying peak magnitude has a maximum deviation from $A_{r\text{-}avg}$ which is less than or equal to 10%.

8. The apparatus of claim 7 wherein the homogenous volume is at least $30 \times 10^3$ cm$^3$.

9. The apparatus of claim 8 wherein L is at least 1.0 meter.

10. The apparatus of claim 1 wherein the D/L ratio is less than or equal to 0.25.

11. The apparatus of claim 1 wherein the radio frequency field has a frequency of at least 20 megahertz.

12. The apparatus of claim 1 wherein the radio frequency field has a frequency of at least 80 megahertz.

13. The apparatus of claim 1 wherein each of the plurality of inductive elements comprises a discrete conductor which follows a sinuous path such that during use of the apparatus current flows through a first part of the conductor in a first direction that has both longitudinal and azimuthal components and through a second part of the conductor in a second direction that has both longitudinal and azimuthal components, said first and second directions being different.

* * * * *